US005300956A

United States Patent [19]
Ohta et al.

[11] Patent Number: 5,300,956
[45] Date of Patent: Apr. 5, 1994

[54] MULTIBEAM SEMICONDUCTOR LASER ARRAY AND MULTIBEAM LASER PRINTER

[75] Inventors: Takeshi Ohta; Masao Ito, both of Kanagawa, Japan

[73] Assignee: Fuji Xerox Co., Ltd., Tokyo, Japan

[21] Appl. No.: 842,712

[22] Filed: Feb. 27, 1992

[30] Foreign Application Priority Data

Feb. 28, 1991 [JP] Japan .................................. 3-34374
Jun. 28, 1991 [JP] Japan .................................. 3-158608

[51] Int. Cl.⁵ .......................................... B41J 2/455
[52] U.S. Cl. ................................ 346/107 R; 346/108
[58] Field of Search ........................... 346/107 R, 108

[56] References Cited

U.S. PATENT DOCUMENTS

4,878,066  10/1989  Shiraishi .............................. 346/108

FOREIGN PATENT DOCUMENTS

59-47873  3/1984  Japan .
1-45065   2/1989  Japan .
2-39583   2/1990  Japan .

OTHER PUBLICATIONS

R. L. Thorton et al.,: "Properties closely spaced independent addressable lasers fabricated by impurity-induced disordering", Appl. Phys. Lett. 56 (17), pp. 1623–1625 (1990).
R. L. Thorton et al.,: "High Power (2.1 W) 10-stripe AlGaAs laser arrays with Si desordered facet windows", Appl. Phys. Lett. 49 (23), pp. 1572–1574 (1986).
Tanaka, "Examination on Tone Reproduction in Laser Xerography", The 6th Color Engineering Conference, pp. 77–80 (1989).

Primary Examiner—Benjamin R. Fuller
Assistant Examiner—David Yockey
Attorney, Agent, or Firm—Finnegan, Henderson, Farabow, Garrett & Dunner

[57] ABSTRACT

A multibeam semiconductor laser array including n pieces of mutually independently drivable semiconductor laser elements which are arranged with a distance r between the elements in such a manner that light leaving centers of respective laser beams emitted from the semiconductor laser elements are aligned on a straight line. In the multibeam semiconductor laser array, the distance r is determined according to the following equation when a light emitting wave length of each of the semiconductor laser elements is expressed as $\lambda$ and a divergence angle of the laser beam in a direction of the straight line is expressed as $\theta_1$:

$$r = I \cdot \frac{2\lambda}{k\pi \sin(\theta_1/2)}$$

where n is an integer equal to or more than 2, $\pi$ is a circle ratio, I is an interlacing period which is a natural number mutually prime to n, and k is a spot diameter correction coefficient which is a real number in the range of $1.4 \leq k \leq 1.8$.

14 Claims, 18 Drawing Sheets n=1, I=1 n=3, I=2 n=4, I=5

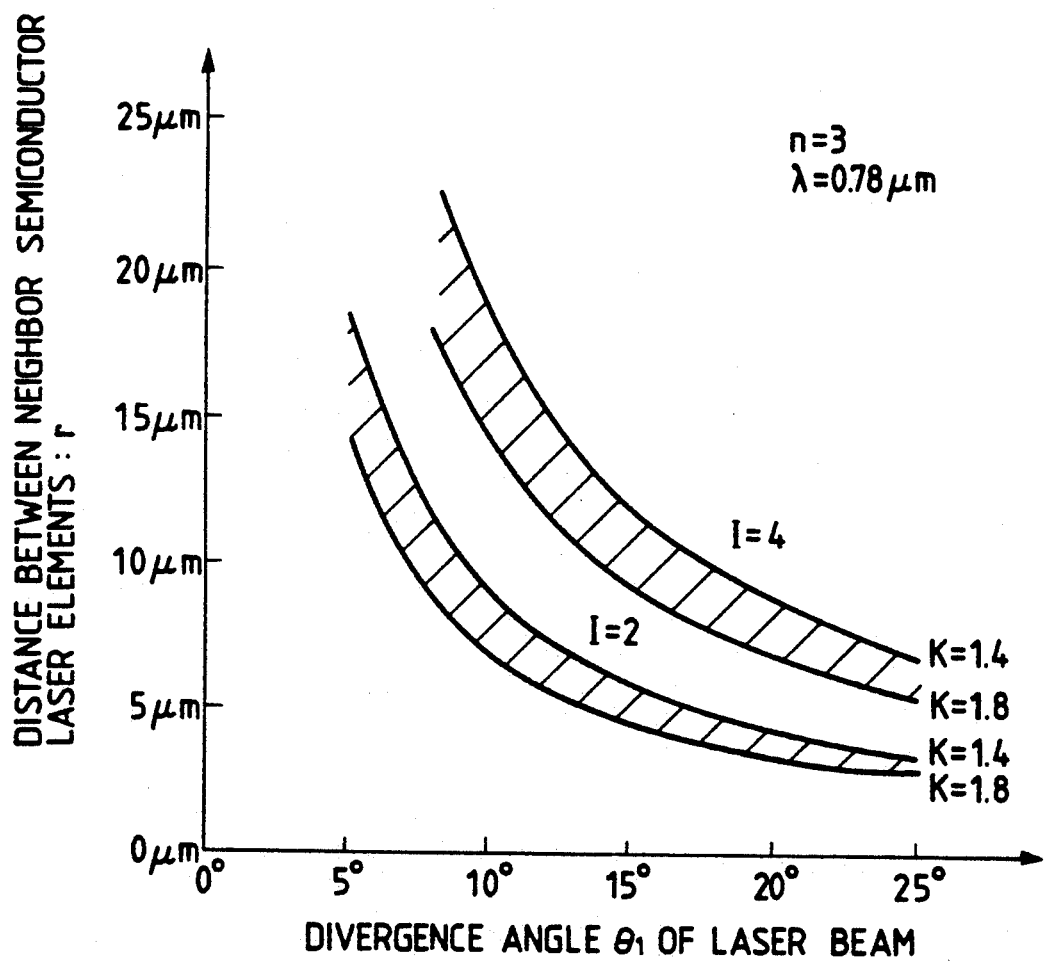

FIG. 11

| n | 2 | 3 | 4 | 5 | 6 | 7 | 8 | 9 | 10 | 11 |
|---|---|---|---|---|---|---|---|---|----|----|
| I | 3 | 2 | 3 | 2 | 5 | 2 | 3 | 2 | 3  | 2  | dx ⇕ ○

(dot pattern array)

○ —— (n, I) PERMITTING INTERLACED SCANNING
▨ —— SPECIALLY DESIRABLE RANGE OF (n, I)

MULTIBEAM SEMICONDUCTOR LASER ARRAY AND MULTIBEAM LASER PRINTER

BACKGROUND OF THE INVENTION

1. Field of the Invention

The present invention relates to a laser beam light source used to write an image by means of light beams in a digital copying machine, a laser beam printer and the like and, in particular, to a multibeam semiconductor laser array serving as a light source which is able to perform simultaneous image writing by a plurality of laser beams and a multibeam laser printer which is constructed by use of such a multibeam semiconductor laser array.

2. Description of the Related Art

In a laser beam printer, a laser beam from a semiconductor laser is irradiated on a rotary polyhedral mirror called a polygon scanner, and the beam reflected from the rotary polyhedral mirror is then irradiated on the surface of a charged photoreceptor which is moving at a constant speed. Rotation of the rotary polyhedral mirror causes the laser beam to scan in a direction perpendicular to the moving direction of the photoreceptor. Since the laser beam is modulated according to the image to be output, there is formed an electrostatic latent image on the photoreceptor and the electrostatic latent image is developed to provide a visible toner image.

However, in the above-mentioned laser beam printer, distances between the scanning lines of the laser beam must be set narrow enough in order to enhance the fineness of an output image. Also, in order to output the image at a high speed, the scanning speed must be increased. The most important problem in improving the image fineness and speed of the laser beam printer is that the rotatory speed of the polygon scanner is limited.

In order to solve the above-mentioned problem, a multibeam scanning system which scans on an image plane at the same time by means of a plurality of laser beams is already known. In this multibeam scanning system, of course, a plurality of laser beam spots must be sufficiently near to each other in a direction (which will be hereinafter referred to as a subsidiary scanning direction) perpendicular to a direction of scanning (which will be hereinafter referred to as a main scanning direction) by a polygon scanner. For this purpose, efforts have been made to manufacture a plurality of semiconductor lasers such that they are near to each other. At present, a semiconductor laser array is made on an experimental basis in which the semiconductor lasers are closely spaced down to a distance of 10 $\mu$m (see, for example, Japanese Patent Unexamined Publication No. Hei. 2-39583, R. L. Thornton et al., "Properties of closely spaced independently addressable lasers fabricated by impurity-induced disordering", Appl. Phys. Lett. 56(17), 1623–1625 (1990) and the like).

However, even if the plurality of semiconductor lasers are closely spaced around 10 $\mu$m by employing the techniques respectively disclosed in the above-mentioned Japanese Patent Unexamined Publication and the like, such distance is not sufficient to scan leaving no spaces in the subsidiary scanning direction. As means for making up for such insufficiency, there has been proposed a method which can scan the above-mentioned unscanned spaces in the subsidiary scanning direction by means of interlaced scanning (see Japanese Patent Examined Publication No. Hei. 1-45065). Also, there has been proposed a multibeam scanning optical system using a semiconductor laser array including a plurality of semiconductor lasers spaced 10 $\mu$m from each other.

In FIG. 1, an example of interlaced scanning is shown. In this example, interlaced scanning is carried out by two laser beams L1 and L2. In FIG. 1, $d_x$ designates a laser spot diameter to be defined electrophotographically (which is hereinafter referred to as an electrophotographic spot diameter). The electrophotographic spot diameter is not a optically defined laser spot diameter existing on an image plane A1, but it means a diameter of a spot occurring when an electrostatic latent image formed on the image plane A1 by a laser is developed. A distance $r_3$ between the centers of two spots B1 and B2 formed on the image plane A1 by the two laser beams L1 and L2 is $3d_x$.

Since subsidiary scanning is performed by $2d_x$ in each main scanning, as shown in FIG. 1, in the first scanning a second scanning line is scanned by the laser beam L2, and in the second scanning a first scanning line is scanned by the laser beam L1 and a fourth scanning line is scanned by the laser beam L2. In this manner, the following scanning lines are scanned sequentially without leaving any scanning lines between them. In other words, although some of scanning lines are left unscanned in each scanning, the line scanned in a certain scanning time is jumped in the next scanning time, so that all of the scanning lines are scanned with no lines left unscanned in the long run.

In order to prevent duplicate scanning and to prevent occurrence of unscanned lines in the interlaced scanning, the following three conditions must be satisfied:

1) The subsidiary scanning must be executed by $nd_x$ with respect to the number of laser beams n in one main scanning.

2) The distance $r_3$ between the two laser beams on the image plane must be an integral multiple of the electrophotographic spot diameter $d_x$.

3) When an integer obtained by dividing the spot center distance $r_3$ by the spot diameter $d_x$ is called an interlacing period I, the interlacing period I must be mutually prime to the number of laser beams n (the greatest common measure between them is 1).

Further, the smallest distance between the scanning lines is referred to as a scanning line pitch which is designated by p in FIG. 1. In general, $p=d_x$. The spot diameter of the laser beam is generally defined by a diameter which allows the light amplitude to be 1/e (1/$e^2$ in power) of that of the spot center. The thus defined spot diameter is hereinafter referred to as an optical spot diameter and is designated by $d_o$.

In the laser beam printer, an image is formed according to an electrophotographic process. However, when the image obtained according to the electrophotographic process is examined, it is preferred to define a spot diameter which is different from the above-mentioned optical spot diameter. That is, a spot diameter of an image finally obtained when a laser beam having a certain light intensity distribution is used is defined as the electrophotographic spot diameter $d_x$ of the laser beam.

In FIG. 2, there is shown a relationship between the optical spot diameter and the electrophotographic spot diameter. In this figure, the light amplitude on the main light ray of the laser beam is normalized to 1. While the optical spot diameter $d_o$ is a diameter in which the light amplitude is 1/e (1/e² in power) of that of the spot center, the electrophotographic spot diameter $d_x$ is a diameter in which the light amplitude is x times of that of the spot center (x≈0.7, when converted to a power ratio, approximately 0.5) (see "Examination on Tone Reproduction in Laser Xerography" proposed by Tanaka, the 6th Color Engineering conference, p. 77–p. 80 (1989)) Here, a ratio of the optical spot diameter $d_o$ to the electrophotographic spot diameter $d_x$ is referred to as a spot diameter correction coefficient k, and k is defined as follows:

$$k = d_o/d_x$$

The value of k varies according to the processes of electrophotography used. In a process of reversal development in which a toner is attached to a light exposed area, $1.4 \leq k \leq 1.6$ is desirable. On the other hand, in a process of forward development in which the toner is attached to a light exposed area, $1.5 \leq k \leq 1.8$ is desirable.

The laser beam printer basically employs an image forming method based on the electrophotographic process and, of course, a light source used in the laser beam printer must be able to allow a photoreceptor for electrophotography to emit a wave length having a practical sensitivity. In recent years, compact disc players have been mass produced so that the costs of AlGaAs semiconductor lasers having a light emitting wave length of 0.78 μm used in the compact disc players have been reduced. Due to this, the development of photoreceptors for electrophotography in conformity with the above light emitting wave length has been advanced and at present photoreceptors having sufficient performance are being practically used. Partly because a photoreceptor having a sensitivity to a light with a long wave length is generally apt to be unreliable, at present, it can well be said that there exist almost no photoreceptors which have a practical sensitivity to the light having a wave length longer than 0.78 μm. From this point of view, it can be said that a semiconductor laser used in the laser beam printer should be able to emit a light having a wave length shorter than approximately 0.8 μm. Practically, it is desired to emit a light having a further shorter wave length and thus an AlGaInP semiconductor laser which is able to emit a light with a wave length of the order of 0.68 μm is more suited for the laser beam printer.

In the semiconductor laser array to be used in the above-mentioned applications, however, a plurality of semiconductor laser elements are disposed very closely to each other and, therefore, it is difficult to arrange collimators individually with respect to each semiconductor laser element. From this point of view, every laser beam light must be focused on an image plane with the same optical system. Using the optical configuration, however, it is almost impossible to independently change a spot diameter and a spot distance on the surface to be scanned. This makes it critical for optical conditions to be set in such a manner that a proper interlaced scanning can be performed.

Also, it seems that, according to the above-mentioned interlaced scanning, even if the image forming spot distance is set to be wide on the image plane, no problem arises provided that a proper interlacing period is selected. However, in fact, if the image spot distance is set to be wide and a great interlacing period (which is hereinafter referred to as an interlacing period of higher order) is employed, then very high mechanical precision is required of a scanning device. Description will be given below of reasons for such very high mechanical precision:

As shown in FIG. 3 (a), when the image plane is scanned by a spot B, that is, when the number of semiconductor laser elements n=1 and the interlacing period I=1, if it is assumed that a scan pitch p must be within a certain error Δp, then a tolerance $\delta_o$ of a speed in the subsidiary scanning direction can be expressed by the following equation:

$$\delta_o = \Delta v/v = \Delta p/p$$

where v and Δv denote the subsidiary scanning speed and the error of v, respectively.

FIG. 3 (b) shows a case in which the number of semiconductor laser elements n=3 and the interlacing period I=2. Assuming that a tolerance of the speed is $\delta_{n,I}$ when the number of semiconductor laser elements is expressed as n and the interlacing period is expressed as I, then the tolerance of the speed in this case, $\delta_{3,2} = \Delta p/3p = \delta_o/3$. Accordingly, the tolerance of the speed is reduced to ⅓ when compared with that obtained in the case of FIG. 3 (a).

As shown in FIG. 3 (c), when the number of semiconductor laser elements n=4 and the interlacing period I=5, then there is obtained the tolerance $\delta_{4,5} = \Delta p/16p = \delta_o/16$. This means that the required a precision increases more than one decade compared with the case shown in FIG. 3 (a).

In the above discussion, description has been given of the tolerance of the speed in the subsidiary scanning direction. Besides the tolerance of the speed in the subsidiary scanning direction, similar problems occur in the accuracy of the optical system and the dimensional accuracy of the semiconductor laser array. In addition, when the image forming spot distance is set to be wide and a high order interlacing period is employed, then the required number high speed memories, which are expensive, to control the interlaced scanning are increased.

SUMMARY OF THE INVENTION

The present invention aims at eliminating the above-mentioned drawbacks found in the conventional multibeam semiconductor laser arrays and multibeam laser printers. Accordingly, it is an object of the invention to perform an interlaced scanning by means of a single scanning optical system without generating clearances between the image forming spots or duplicate scanning. Further, it is another object of the invention to satisfy conditions for interlaced scanning by use of an optical system having a relatively small aperture value. Furthermore, it is still another object of the invention to construct a laser beam printer of a small size by use of an optical system having a small aperture value (truncation ratio).

In order to achieve the above-mentioned objects, according to the invention, there is provided a multibeam semiconductor laser array comprising n pieces of mutually independently drivable semiconductor lasers which are arranged with a distance r between the lasers in such a manner that light leaving centers of respective lasers are aligned on a straight line, wherein the above-mentioned distance r is determined according to the following equation when a light emitting wave length of each of the semiconductor laser elements is expressed as $\lambda$ and a divergence angle of the laser beam in a direction of the above-mentioned straight line is expressed as $\theta_1$:

$$r = I \cdot \frac{2\lambda}{k\pi \sin(\theta_1/2)} \quad (1)$$

where n denotes an integer equal to or more than 2, $\pi$ denotes a circle ratio, I denotes an interlacing period which is a natural number mutually prime to n, and k denotes a spot diameter correction coefficient which is a real number in the range of $1.4 \leq k \leq 1.8$.

Furthermore, in place of the equation (1), the distance r can also be determined according to the following equation:

$$r = I \cdot \frac{2A\lambda}{k\pi \sin(\theta_1/2)} \quad (2)$$

where I is an integer mutually prime to n and in the range of $2 \leq I \leq 5$, k is a spot diameter correction coefficient which is a real number in the range of $1.4 \leq k \leq 1.8$, and A denotes a spot diameter enlargement coefficient which is a real number in the range of $1.34 \leq A \leq 1.97$.

Furthermore, the multibeam laser printer of the invention uses as a light source a multibeam semiconductor laser array which satisfies the conditions of the above equation (2), and limits the spread of the laser beam emitted from the multibeam semiconductor laser array in the direction of the above-mentioned straight line at a position of a beam diameter corresponding to between $1/e^2$ and $\frac{1}{2}$ of the intensity of the center of the laser beam, where e denotes a base of a natural logarithm.

BRIEF DESCRIPTION OF THE DRAWINGS

FIG. 8 is a graphical representation of a relationship between the divergence angle $\theta_1$ of the laser light and the center distance r of the semiconductor laser elements when the number of the semiconductor laser elements n=3 and the wave length $\lambda=0.78$ $\mu$m;

FIG. 11 is an explanatory view of a positional relationship between image forming spots on an image plane in the interlacing period I of the lowest order obtainable in the respective numbers of semiconductor laser elements n=2 to n=11;

DETAILED DESCRIPTION OF THE PREFERRED EMBODIMENT

First, description will be given below of the operation of the present invention by way of concrete examples.

Figure 1:
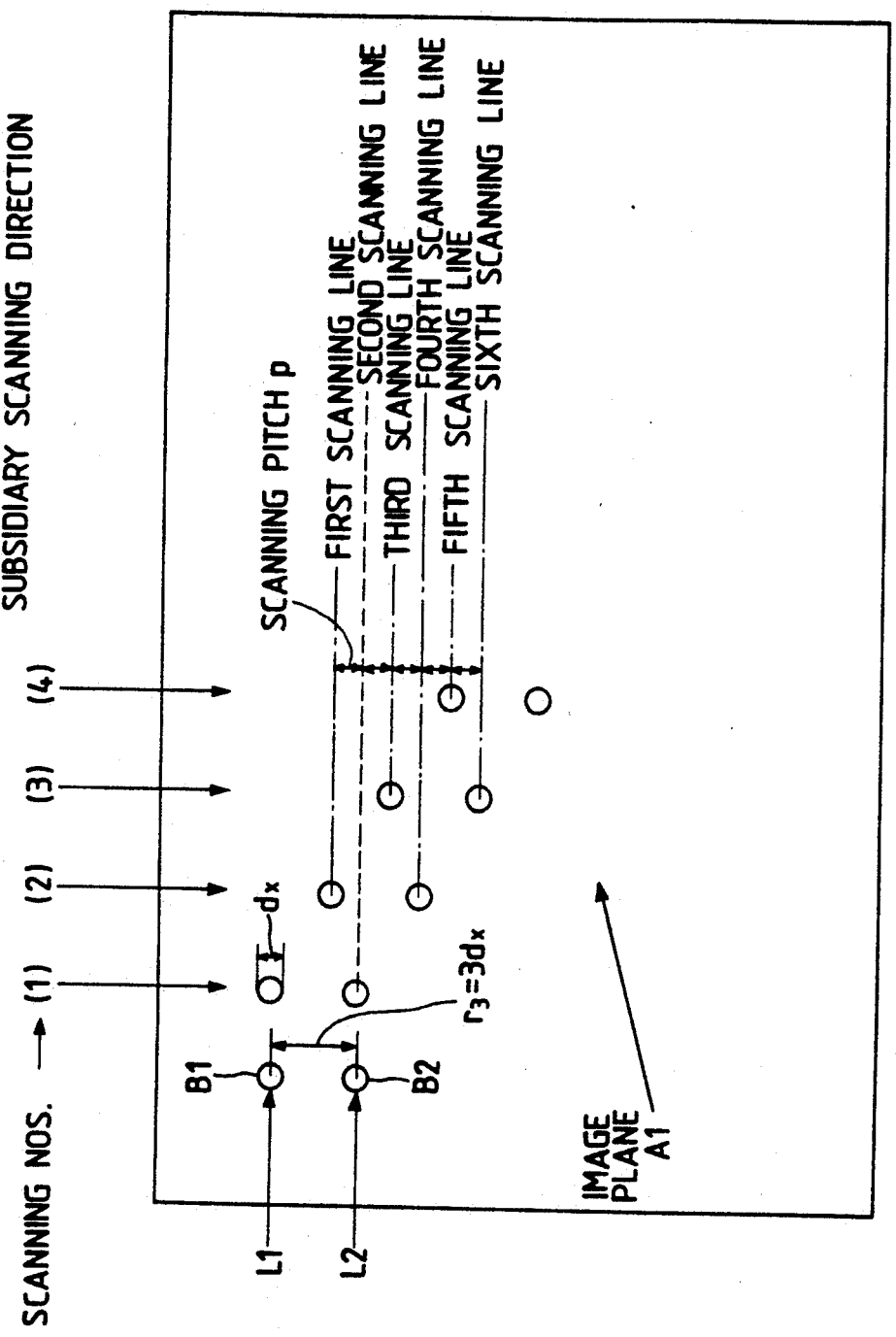
FIG. 1 is an explanatory view of the principle of an interlaced scanning, illustrating a relationship between an image forming spot of a laser light on an image plane and a scanning line.
Figure 2:
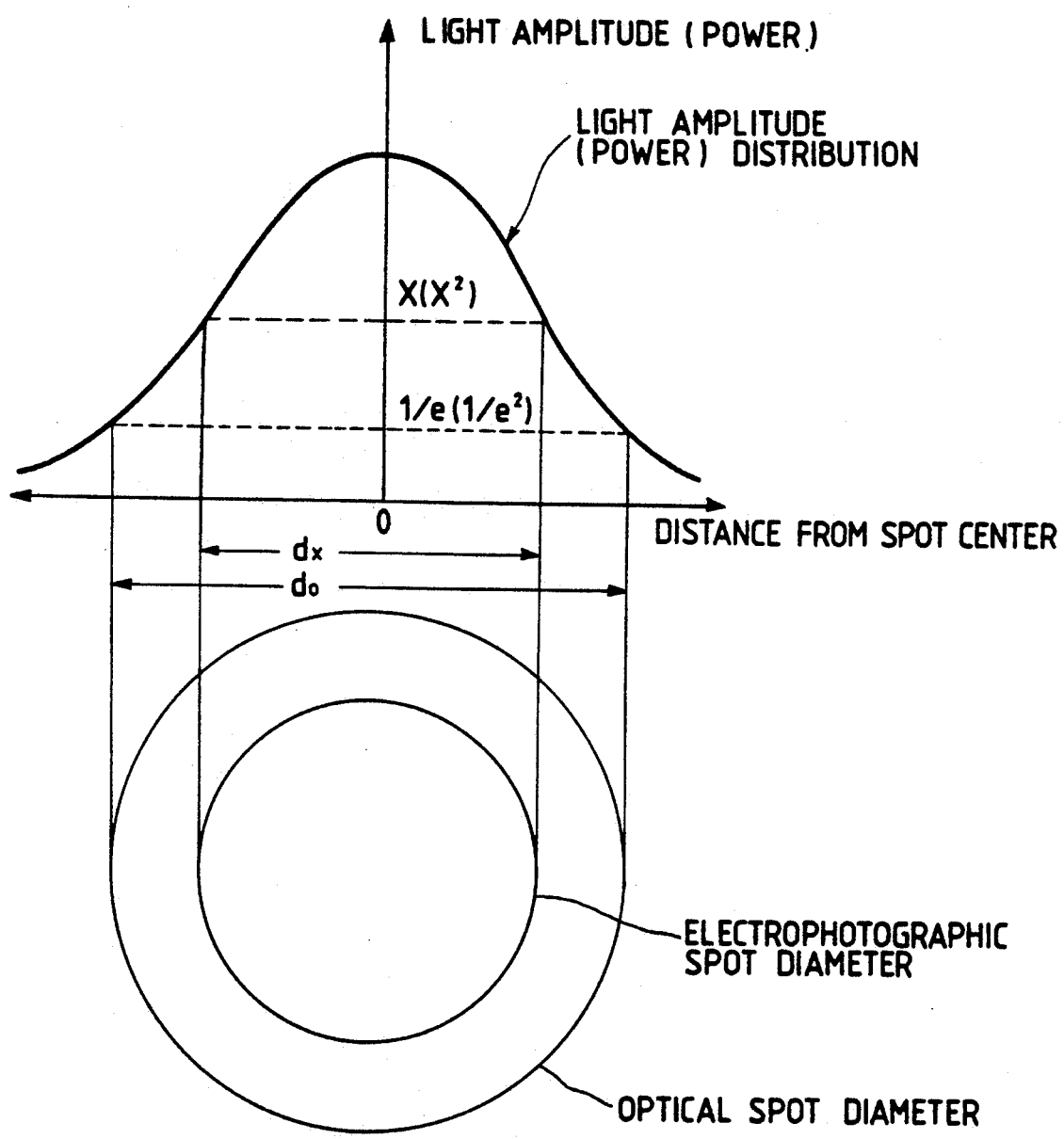
FIG. 2 is an explanatory view of a relationship between an electrophotographic spot diameter and an optical spot diameter.
Figure 3A:
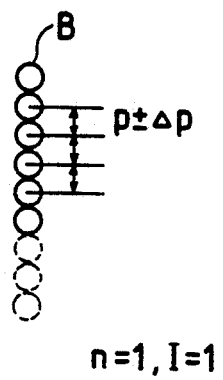
FIGS. 3 (a) to 3 (c) are explanatory views of positional (speed) errors in the subsidiary scanning direction of a scanning device which performs an interlaced scanning operation.
Figure 3B:
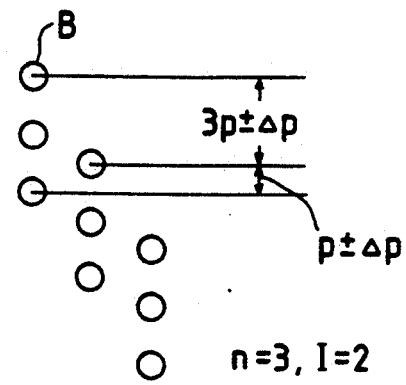
Figure 3C:
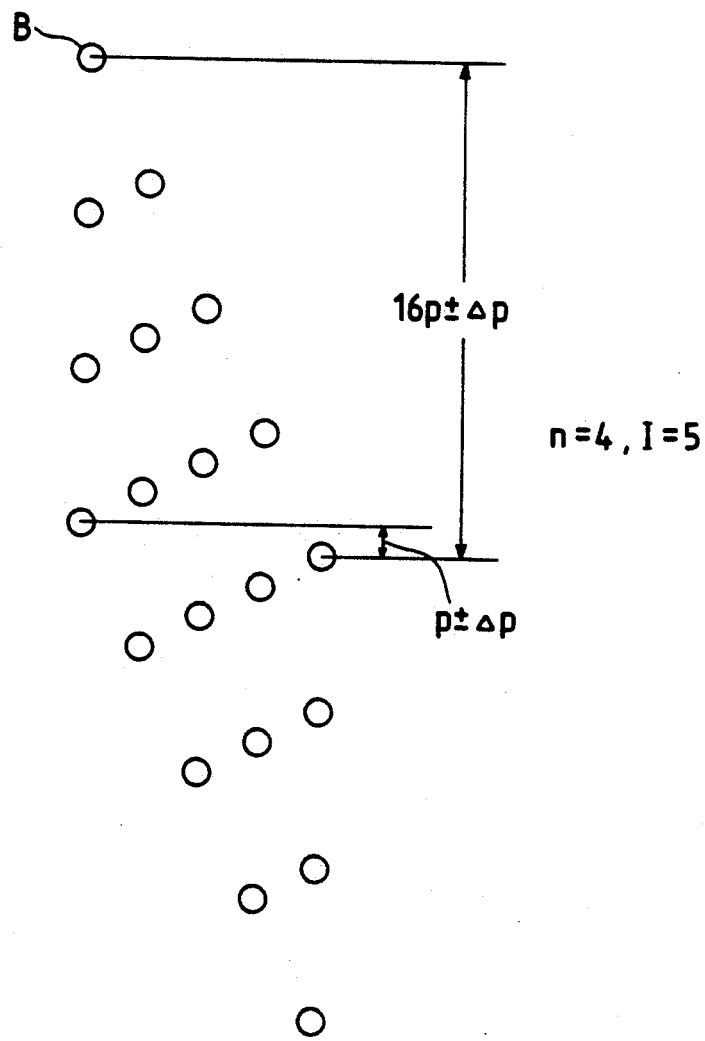
Figure 4:
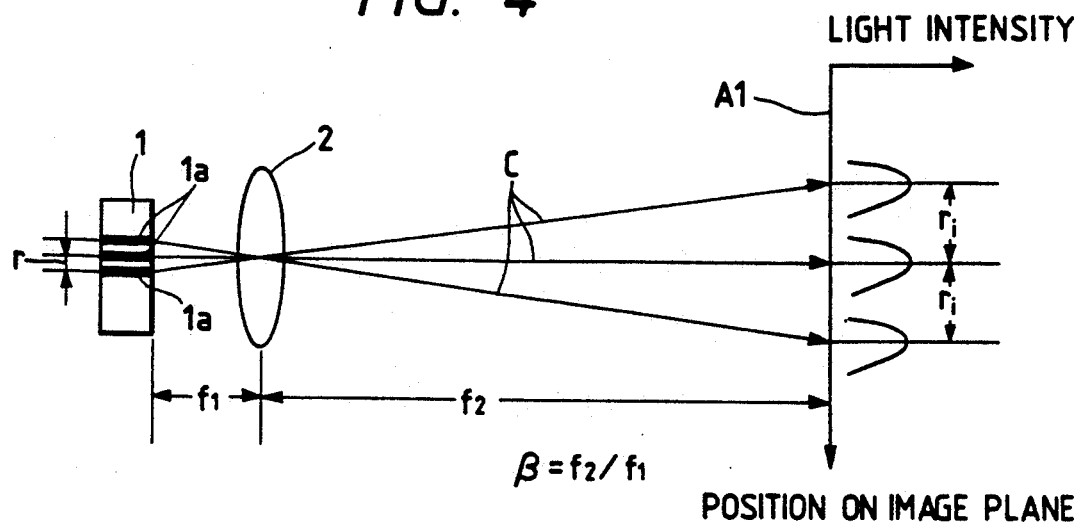
FIG. 4 is an explanatory view of a relationship between a semiconductor laser array and an image forming optical system.

Now, in an optical system in which a plurality of laser beams C respectively coming from a plurality of semiconductor laser elements 1a, 1a, ... disposed on a semiconductor laser array 1 as shown in FIG. 4 are focused on an image plane A1 by means of a lens 2, if a distance between the semiconductor laser elements 1a, 1a, ... is expressed as r, and an image forming spot distance on the image surface A1 is expressed as $r_i$, then the following equation can be obtained, where a distance between the semiconductor laser elements and the lens 2 is expressed as $f_1$ and a distance between the lens 2 and the surface A1 is expressed as $f_2$:

$$r_i = \beta r = \beta I \cdot \frac{2\lambda}{k \pi \sin(\theta_1/2)} \quad (3)$$

In this equation, $\beta = f_2/f_1$ and $\beta$ is a lateral magnification of the optical system.

Figure 5:
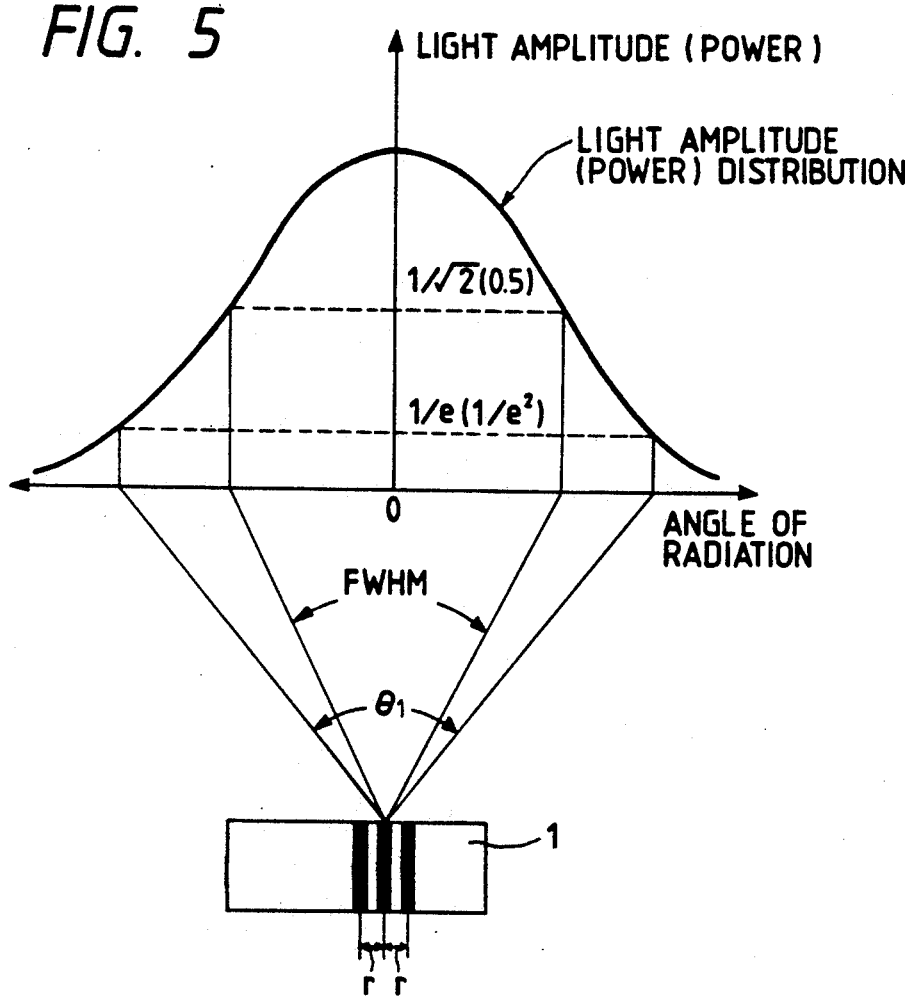
FIG. 5 is an explanatory view of a radiation angle dependency of the amplitude of a laser light emitted from a semiconductor laser.

Further, $\theta_1$ denotes a divergence angle of the laser beam C. This divergence angle is an angle of spread relating to a direction in which the plurality of semiconductor laser elements 1a are arranged. The divergence angle $\theta_1$ of the laser beam, as shown in FIG. 5, is an angle at which a light amplitude per unit angle is $1/e$ ($1/e^2$ in power) when a light amplitude on a main light ray of the laser beam is normalized to 1. $\theta_1$ is determined almost uniquely according to the structure of the semiconductor laser elements. In addition, the divergence angle of the laser beam can often be expressed by an angle (FWHM: Full Width at Half Mean) at which power per unit angle on a main ray of the laser beam light rays is a half (while the light amplitude is $1\sqrt{2}$). However, the divergence angle used in the present invention is not the FWHM.

In this case, an electrophotographic spot diameter $d_{xi}$ of the laser on the image plane can be expressed by the following equation:

$$d_{xi} = \beta \cdot \frac{2\lambda}{k \pi \sin(\theta_1/2)}$$

Therefore, a ratio of $r_i$ to $d_{xi}$ can be expressed by the following equation and condition for interlaced scanning can be satisfied with respect to an arbitrary lateral magnification.

$$r_i/d_{xi}=I$$

Figure 6:
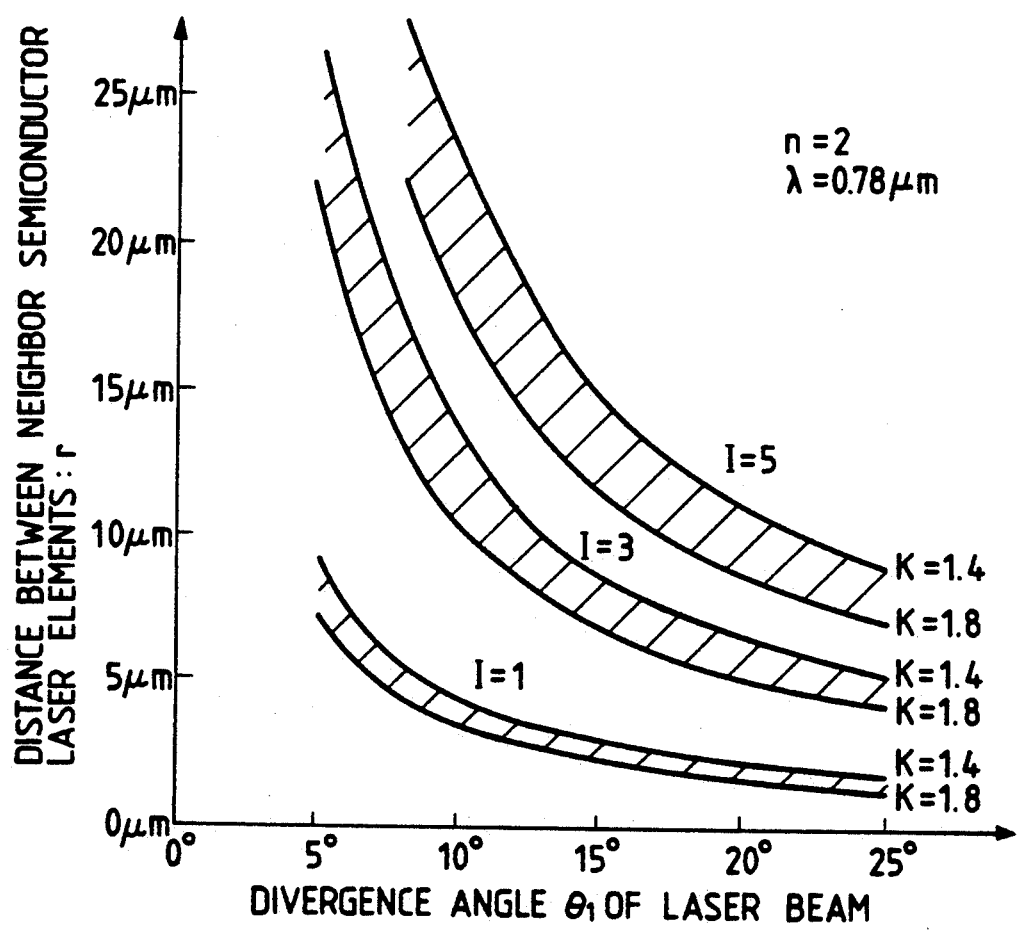
FIG. 6 is a graphical representation of a relationship between the divergence angle 8 of the laser light and the center distance r of the semiconductor laser elements when the number of the semiconductor laser elements n=2 and the wave length $\mu=0.78$ $\mu$m.

In FIG. 6, there is shown a graphical representation which graphically represents a relationship between the divergence angle $\theta$hd 1 of the laser beam and the distance r between the semiconductor laser elements when the number of the semiconductor laser elements n=2, and the light emitting wave length $\lambda = 0.78$ μm. Ranges enclosed by oblique lines shown in FIG. 6 satisfy $1.4 \leq k \leq 1.8$ in the above-mentioned equation (1), with respect to the spot diameter correction coefficient k. FIG. 6 shows a case when the interlacing period I=1, 3 and 5. In this case, however, when I=1, this does not represent a condition for the interlaced scanning, but represents a condition under which adjoining spots are sufficiently close to one another and thus all spots can be scanned by a single scanning operation with no spots left unscanned.

Figure 7:
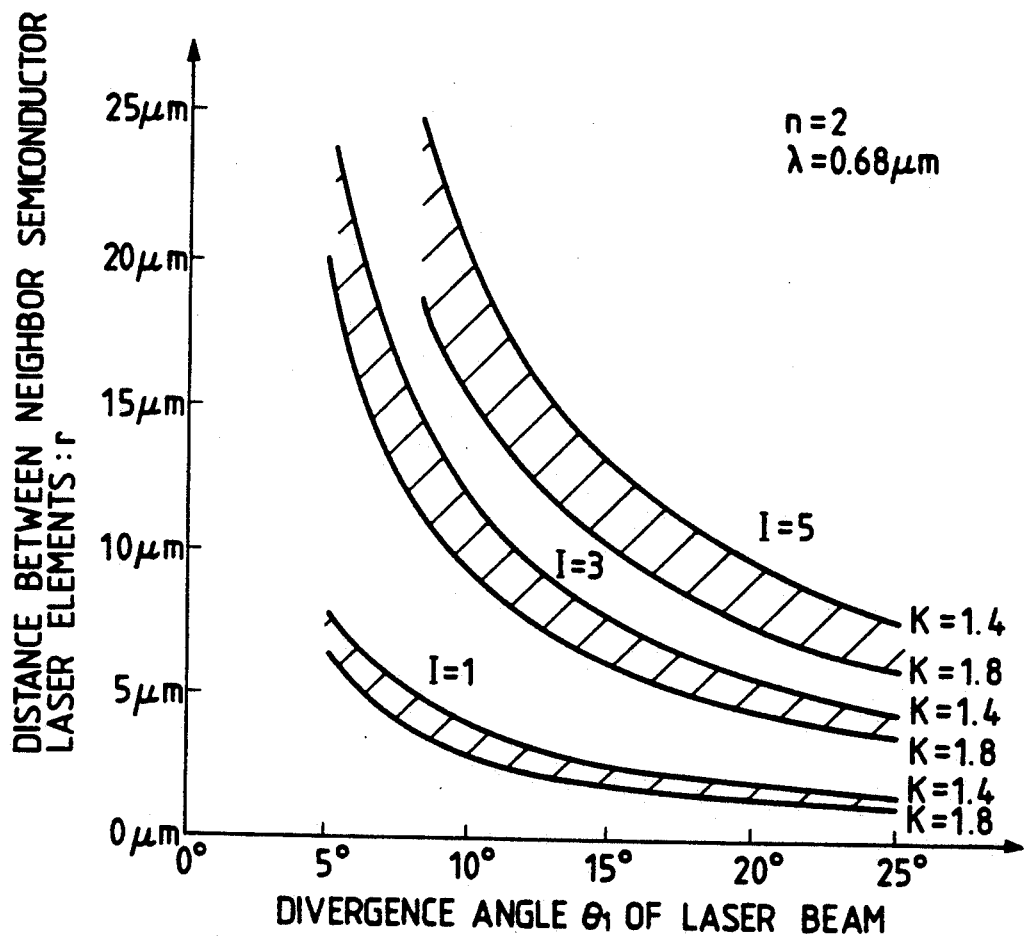
FIG. 7 is a graphical representation of a relationship between the divergence angle $\theta_1$ of the laser light and the center distance r of the semiconductor laser elements when the number of the semiconductor laser elements n=2 and the wave length $\mu=0.68$ $\mu$m.
Figure 9A:
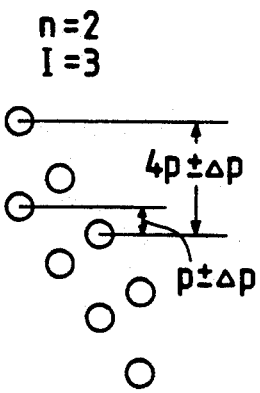
FIGS. 9 (a) to 9 (e) are explanatory views of the positional (speed) errors in the subsidiary scanning direction required when the number n of semiconductor laser elements and the interlacing period I are changed in various ways.
Figure 9B:
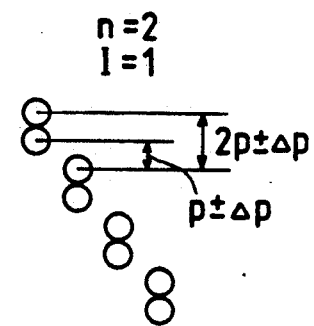
Figure 9C:
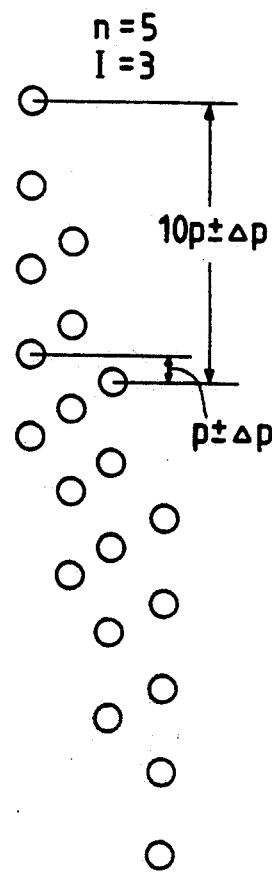
Figure 9D:
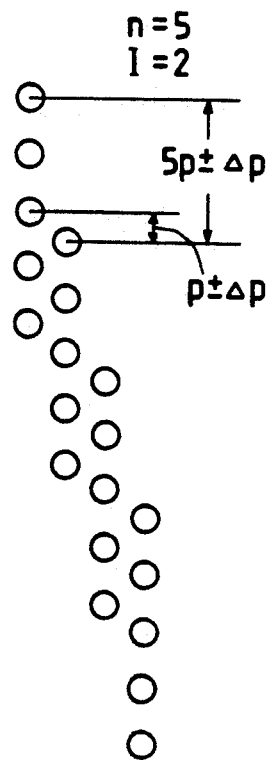
Figure 9E:
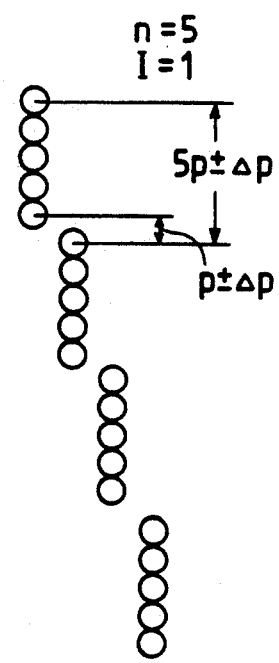

In FIG. 7, there is shown a graphical representation which graphically represents a relationship between the divergence angle $\theta_1$ and the distance r between the semiconductor laser elements when n=2 and $\lambda = 0.68$ μm. Further, referring further to FIG. 6 and 7, they are respectively graphical representations which hold as well when n=4, 8, 10 and the like.

In FIG. 8, there is shown a graphical representation which graphically represents a relationship between the divergence angle $\theta_1$ and the distance r between the semiconductor laser elements when n=3 and $\lambda = 0.78$ μm. When n is an odd number, I=2 is always possible and a relationship between $\theta_1$ and r in this case is represented by oblique lines shown in FIG. 8 when I=2.

FIG. 9 (a) shows a view which represents an interlaced scanning when n=2 and I=3, in which there is provided a positional (speed) error $\delta_{2,3} = \delta_o/4$. Also, FIG. 9 (b) shows a view representing an interlaced scanning when n=2 and I=1, providing the positional (speed) error $\delta_{2,1} = \delta_o/2$.

When the number n of the semiconductor laser elements is an even number and at the same time when the interlacing period I is a natural number equal to or more than 3 and is also the smallest natural number mutually prime to n, an interlaced scanning of the lowest order can be realized, which conveniently leads to a lower positional (speed) accuracy in the subsidiary scanning direction.

Figure 10:
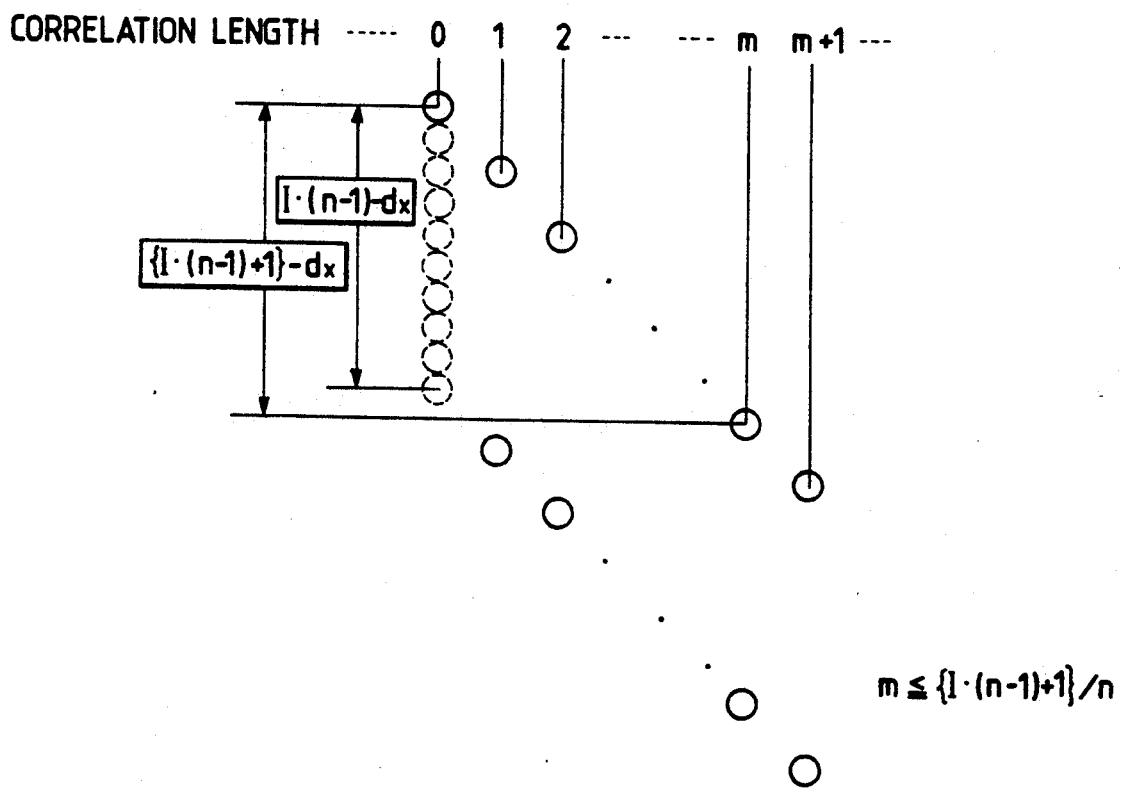
FIG. 10 is an explanatory view of a relationship between the number of semiconductor laser elements n=2, the interlacing period I and the correlation length m in an interlaced scanning.

Further, if the number n of the semiconductor laser elements is set to be an odd number, then an interlaced scanning for the interlacing period I=2, which is one for the theoretically possible lowest order, can be realized, which also leads to a lower positional (speed) accuracy in the subsidiary scanning direction. FIG. 9 (c), shows a case when n=5 and I=3. In this case, there is provided the positional (speed) error $\delta_{5,3} = \delta_o/10$. FIG. 9 (d) shows a case when n=5 and I=2, in which there is provided $\delta_{5,2} = \delta_o/5$. This positional (speed) error is double what is provided when I=3 and it is also equal to $\delta_{5,1} = \delta_o/5$ which is provided when n=5 and I=1 as shown in FIG. 9 (e). The positional (speed) error $\delta_{n,I}$ can be generally expressed as a function of n and I by the following equation:

$$\delta_{n,I} = \delta_o/\text{mn}$$

where m is the greatest integer that satisfy a condition of $m \leq \{I \cdot (n-1) + 1\}/n$.

m is a correlation length which is defined as follows: When the spots are arranged densely in the subsidiary scanning direction, as shown in FIGS. 9 (b) and 9 (e), a spot drawn in a certain scanning and a spot drawn in the next scanning only adjoin each other. However, in the interlaced scanning, a spot drawn in a certain scanning can adjoin spots which are drawn in until m-times scanning. This m is defined as a correlation length. This relation is typically shown in FIG. 10.

When the number n of the semiconductor laser elements is an odd number and the interlacing period I=2, then there is provided the correlation length m=1, which means that a required positional (speed) error in the subsidiary scanning direction is equal to that provided when the spots are arranged densely in the subsidiary scanning direction.

Furthermore, when the number n of the semiconductor laser elements n is set to be an even number, if the interlacing period I is set to be the smallest natural number equal to or more than 3 and mutually prime to n, then an allowed positional (speed) error in the subsidiary scanning direction can be made the greatest (while the accuracy is made the lowest).

Figure 11:
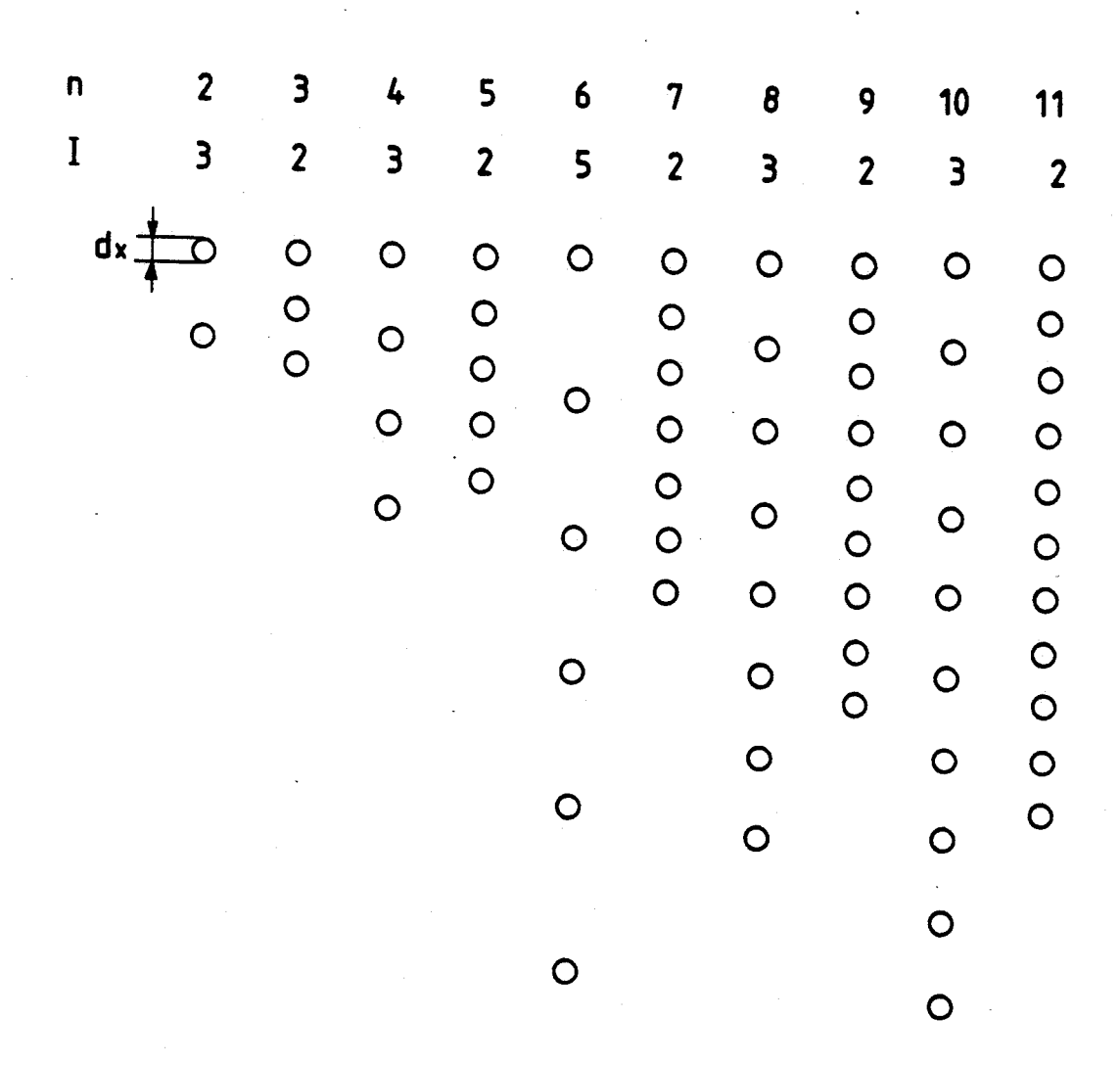

In FIG. 11, there is shown a view of a positional relationship between the spots on the surface to be scanned for interlacing period of the possible lowest orders respectively when the number of the semiconductor laser elements n=2 through n=11.

Table 1 shows the relation among the parameters, number of semiconductor laser elements n, the lowest interlacing period $I_{min}$, correlation length m, the distance between neighbor semiconductor laser elements r, and normalized error ratio $\delta_{n,I}/\delta_o$, where $\delta_1 = 12°$, $\lambda = 0.78$ μm and k=1.5.

TABLE 1

| n | 2 | 3 | 4 | 5 | 6 | 7 | 8 | 9 | 10 | 11 |
|---|---|---|---|---|---|---|---|---|----|----|
| $I_{min}$ | 3 | 2 | 3 | 2 | 5 | 2 | 3 | 2 | 3 | 2 |
| m | 2 | 1 | 2 | 1 | 4 | 1 | 2 | 1 | 2 | 1 |
| r (μm) | 10.5 | 7.0 | 10.5 | 7.0 | 17.5 | 7.0 | 10.5 | 7.0 | 10.5 | 7.0 |
| $\delta_{n,I}/\delta_0$ | 1/3 | 1/3 | 1/3 | 1/5 | 1/24 | 1/7 | 1/18 | 1/9 | 1/20 | 1/11 |

Figure 12:
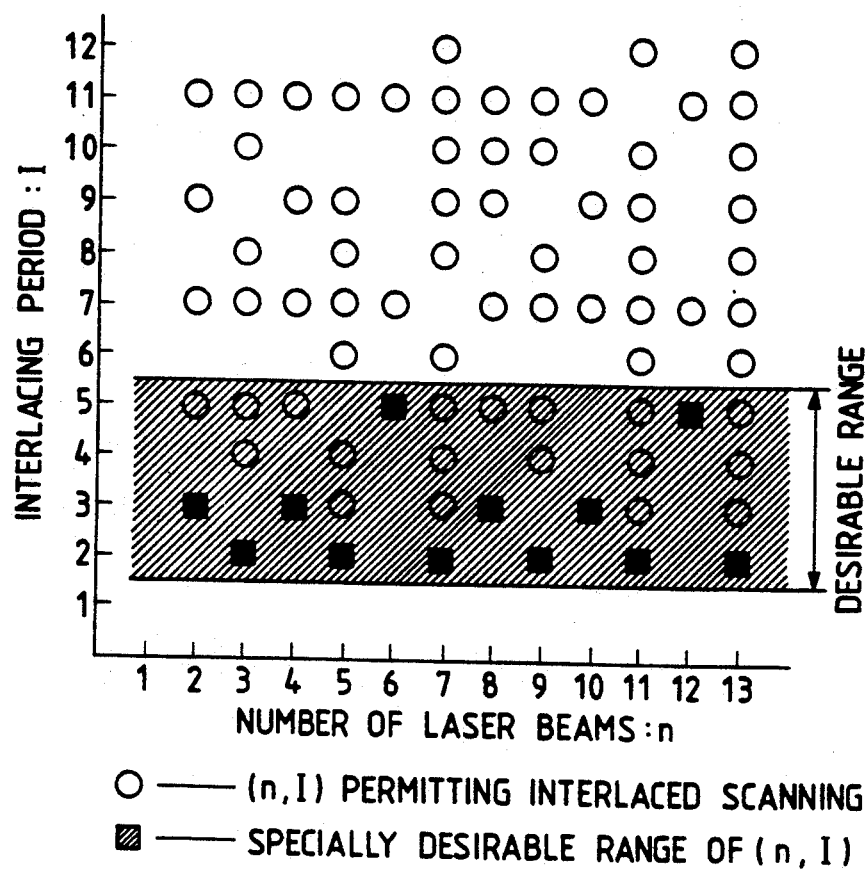
FIG. 12 is an explanatory view of a combination of the number of laser beams n and the interlacing period I which enable an interlaced scanning.

From the viewpoint of mechanical precision, it is preferable that the interlacing period I is smaller. However, in this case, that is, in a semiconductor laser array in which semiconductor laser elements are arranged close to one another, it is difficult to prevent cross-talks between the elements. In other words, from the viewpoint of manufacturing a semiconductor laser array, it is preferable that the interlacing period I is greater. According to these facts, the practical range of the interlacing period may be the range between 2 and 5. Such a relationship is shown in FIG. 12.

By the way, in order to satisfy the above-mentioned equation (3), the optical system must have a sufficiently great aperture. On the other hand, for the purpose of manufacturing a laser beam printer of a small size, the optical system is desired to be small even if it may loose a slight amount of light. Further, when a small F-number is used, the diameter of a polygonal mirror must be big in order to prevent optical vignetting. However, this is not preferable from the viewpoint of speeding-up of the laser beam printer. Due to this, it can be expected that a suitable optical stop is provided in the optical system of the laser beam printer. In the laser optics, small aperture does not only lead to light power loss, but also makes the focused spot diameter large, due to diffraction of the aperture. As a result of this, there is a possibility that an interlaced scanning cannot be realized by the condition of the equation (3).

In view of the above circumstances, according to a second aspect of the present invention, a multibeam semiconductor laser array includes the following structure: that is, according to the present multibeam semiconductor laser array, n pieces of semiconductor laser elements, which are independently addressable, are arranged in such a manner that the optical axes of the leaving beam light rays of the respective elements are parallel to one another and the light leaving centers of the respective light beam are arranged at an equal distance r from one another in a straight line; and, where it is assumed that the light emitting wave length of the semiconductor laser elements is expressed as λ, the divergence angle of the laser beam in the direction of the above-mentioned straight line is expressed as $\theta_1$, the spot diameter correction coefficient is expressed as k, the spot diameter enlargement coefficient is expressed as A, and the interlacing period is expressed as I, then the above distance r must satisfy the following equation:

$$r = I \cdot \frac{2A\lambda}{k\pi \sin(\theta_1/2)}$$

In the above equation, n denotes a circle ratio, I is an integer in the range of $2 \leq I \leq 5$ and mutually prime to n, the spot diameter correction coefficient k is a value in the range of $1.4 \leq k \leq 1.8$, and A is a spot diameter enlargement coefficient which is a real number in the range of $1.34 \leq A \leq 1.97$.

Figure 13:
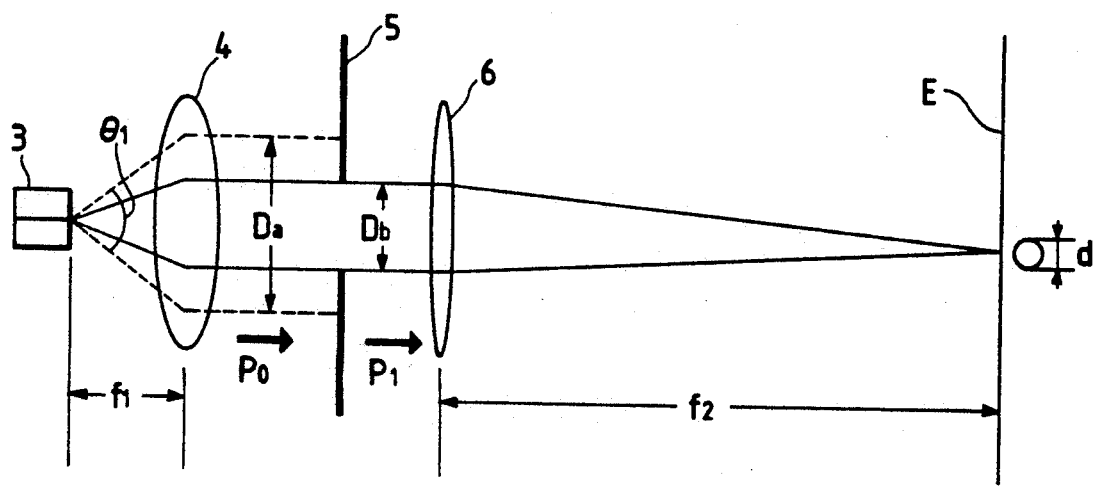
FIG. 13 is an explanatory view of a laser optical system having an optical stop (aperture)

Next, description will be given below of the operation of the present invention by way of a concrete example. Now, let us consider a laser optical system having such an optical stop (aperture) as shown in FIG. 13. In this laser optical system, a laser beam leaving from a laser light source 3 at a divergence angle $\theta_1$ is converted to a parallel light by means of a collimator 4, the diameter of the laser beam is restricted from $D_a$ to $D_b$ by means of an optical stop (aperture) 5, and the laser beam is focused on an image plane E by means of an image forming lens 6. The diameter d of the laser spot focused can be expressed by the following equation:

$$d = A(T) \cdot d_o$$

where T is a truncation ratio, A is a spot diameter enlargement coefficient, and $d_o$ is a laser spot diameter when no optical stop is provided. The meanings of the truncation ratio and spot diameter enlargement coefficient will be described later.

As shown in FIG. 13, if it is assumed that a laser beam diameter corresponding to the divergence angle $\theta_1$ (the definition of the divergence angle $\theta_1$ agrees to the definition provided in FIG. 5) when the laser beam is converted into the parallel beam is expressed as $D_a$, and that a laser beam diameter restricted by the optical stop 5 is expressed as $D_b$, then the truncation ratio T can be represented by the following equation:

$$T = D_b/D_a$$

Figure 14:
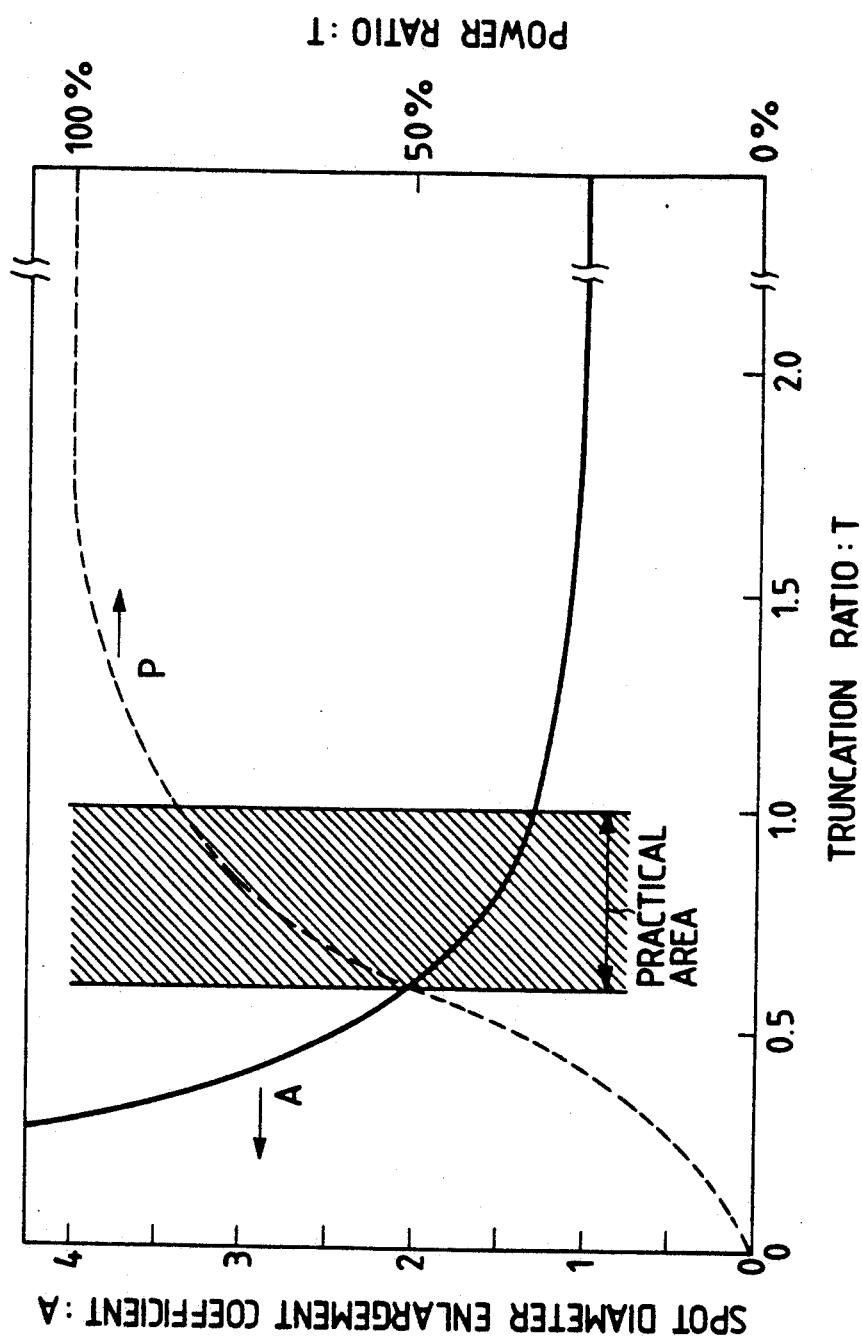
FIG. 14 is a graphical representation of variations of a spot diameter enlargement coefficient and a power ratio with respect to a truncation ratio.

The spot diameter enlargement coefficient A is a function of the truncation ratio T and can be represented by such a graph as shown by a solid curved line in FIG. 14. As can be clearly understood from this graphical representation, the image forming spot diameter d of the laser beam is increased by stopping down the beam. This phenomenon is due to the diffraction of the aperture. Since it is difficult to find the spot diameter enlargement coefficient in an analytical calculation, the spot diameter enlargement coefficient was found according to the numerical analysis by use of a computer. Further, $d_o$ can be expressed by the following equation:

$$d_o = 2\lambda/\pi \sin(\theta\text{hd }1/2)$$

A curved line, which is shown by a broken line in the graphical representation of FIG. 14, represents a ratio P of a power $P_1$ after passage of the optical stop (aperture) 5 to a power $P_o$ before passage thereof in the optical system shown in FIG. 13. This ratio P can be expressed by the following equation:

$$P = P_1/P_o$$

As can be understood clearly from the graphical representation of FIG. 14, by stopping down the beam (that is, by reducing T), the spot diameter enlargement coefficient A is increased and the diameter of the focused laser spot is also increased, while the power passing through the optical stop 5 is decreased on the contrary.

As described above, as the spot diameter enlargement coefficient A is increased, the spot diameter on the image plane is increased. Due to the fact that a distance between the elements in the multibeam semiconductor laser array having the same interlacing period is proportional to the above spot diameter, if the spot diameter enlargement coefficient A is increased, then the distance between the elements may be wide, which makes it easy to manufacture the laser array. However, in this case, the power of the laser required is also increased and, in order to prevent such an increase in power, it is not desired to stop down the beam so much. A practical range of T, as shown in FIG. 14, may be in the range of $0.59 \leq T \leq 1.00$. This is a structure in which the stop aperture) is disposed at the position of a beam diameter of $1/e^2$ to $\frac{1}{2}$ of the intensity of the center of the laser beam. $A=1.97$ corresponds to $T=0.59$, and $A=1.34$ corresponds to $T=1.00$, respectively. If T is smaller than 0.59, then the power ratio P is lowered and thus the power of the laser required is increased suddenly. On the contrary, if T is larger than 1.00, then the beam diameter is increased to thereby require a large-sized polygon scanner.

As can be understood from the foregoing description, if the distance between the laser elements of the array is determined so as to satisfy the equation (3), then a scanning optical system having a stop (aperture) at the position of the beam diameter of $1/e^2$ to $\frac{1}{2}$ of the center intensity can be used to realize interlaced scannings in the range of the interlacing period from 2 to 5.

Figure 15:
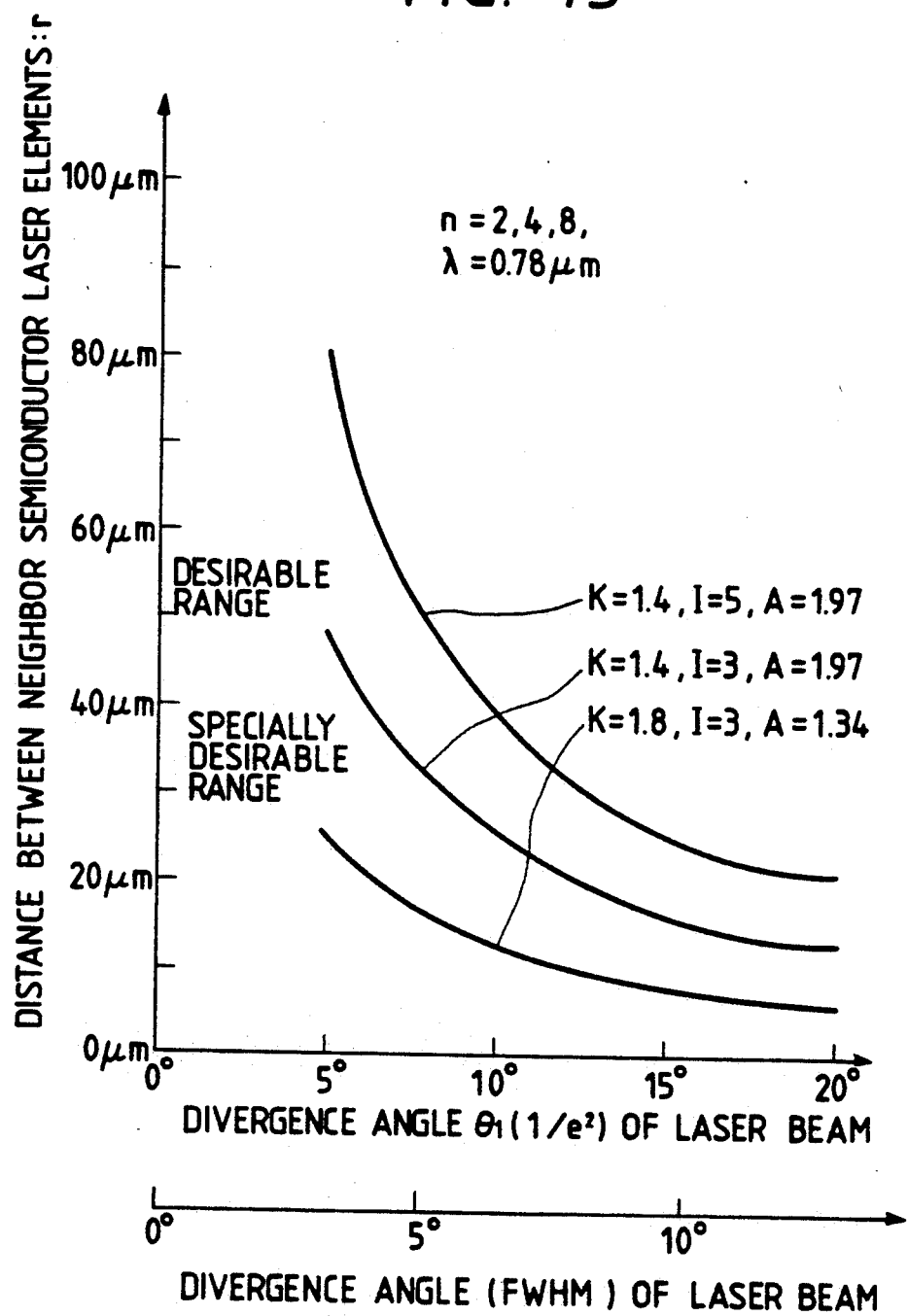
FIG. 15 is a graphical representation of a relationship between the divergence angle $\theta_1$ of the laser light and the center distance r of the semiconductor laser elements when the number of the semiconductor laser elements n=2, 4, 8 and the wave length $\lambda=0.78$ $\mu$m.

FIG. 15 shows a graphical representation of a relationship between the divergence angle $\theta_1$ of the laser beam and the distance r between the neighbor semiconductor laser elements when the number of the semiconductor laser elements $n=2, 4, 8$ and the light emitting wave length $\lambda=0.78$ $\mu$m. FIG. 15 shows an area as an specially desirable range. This area corresponds to an area when the interlacing period $I=3$.

Figure 16:
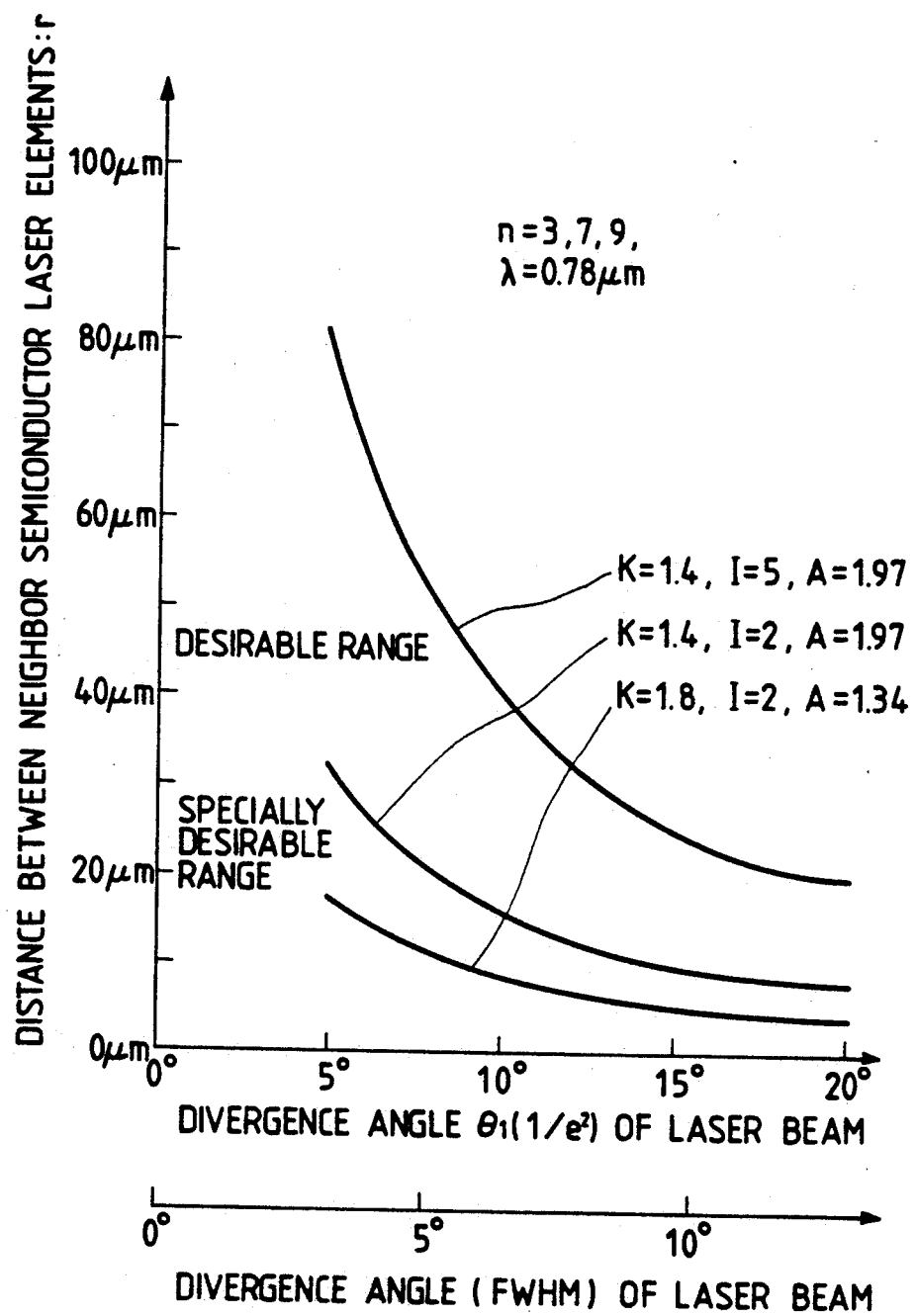
FIG. 16 is a graphical representation of a relationship between the divergence angle $\theta_1$ of the later light and the center distance r of the semiconductor laser elements when the number of the semiconductor laser elements n=3, 7, 9 and the wave length $\lambda=0.78$ $\mu$m.

Also, FIG. 16 shows a graphical representation of a relationship between the divergence angle $\theta_1$ and the neighboring semiconductor laser element distance r when $n=3, 7, 9$ and $\lambda=0.78$ $\mu$m. In this figure, an area shown as a specially desirable range corresponds to an area when the interlacing period $I=2$. In addition, as a scale of the divergence angle $\theta_1$, a case for FWHM is also shown together.

According to the laser beam printer using the above-mentioned multibeam semiconductor laser array as a light source, an optical system having a small aperture value can be used to construct a scanning optical system, thereby realizing a compact laser beam printer. Also, due to the small aperture value, the diameter of the polygonal scanner can be reduced as well.

Next, detailed description will hereunder be given of the preferred embodiments of a multibeam semiconductor laser array and a multibeam laser printer according to the present invention with reference to the accompanying drawings.

Figure 17:
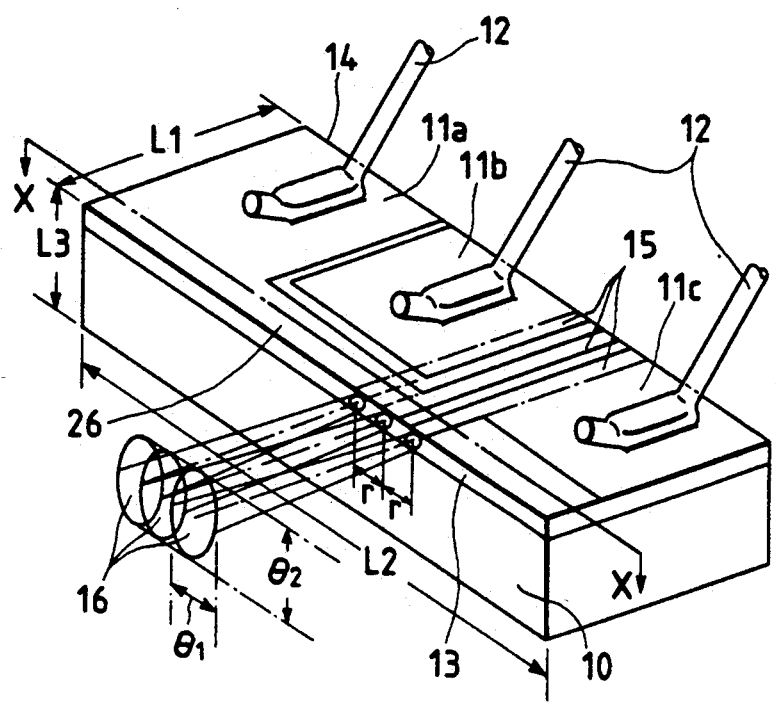
FIG. 17 is a perspective view of an embodiment of a multibeam semiconductor laser array according to the present invention.
Figure 18:
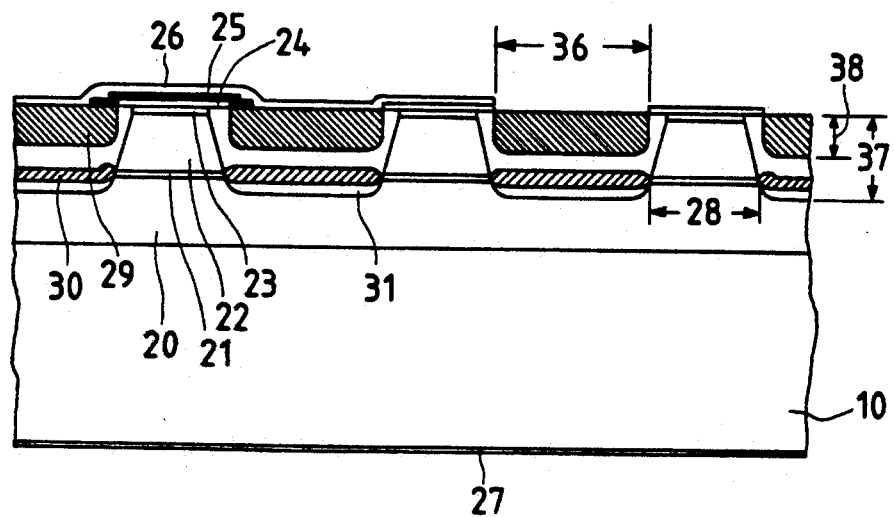
FIG. 18 is a cross-sectional view of the semiconductor laser array shown in FIG. 17, taken along the line X—X.
Figure 19A:
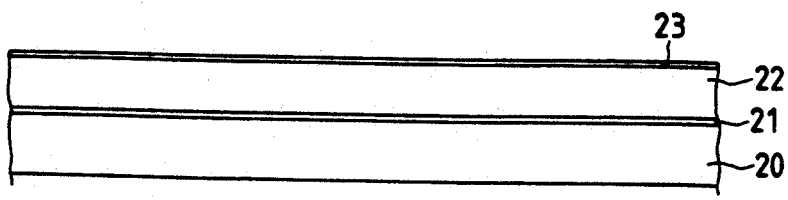
FIGS. 19 (a) to 19 (f) are cross-sectional views illustrating the manufacturing process of the semiconductor laser array shown in FIG. 18.
Figure 19B:
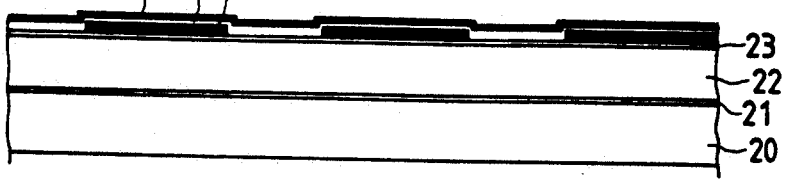
Figure 19C:
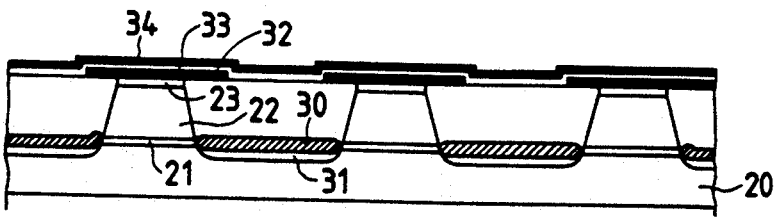
Figure 19D:
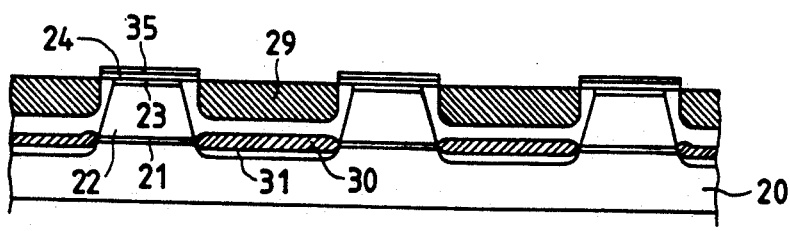
Figure 19E:
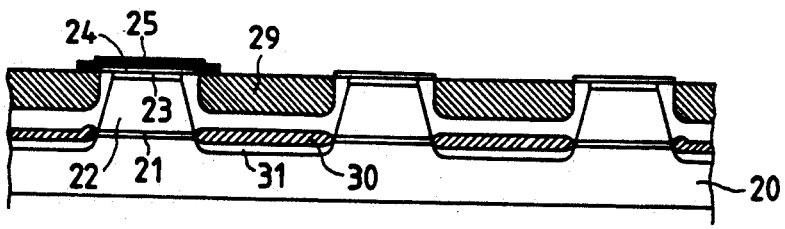
Figure 19F:
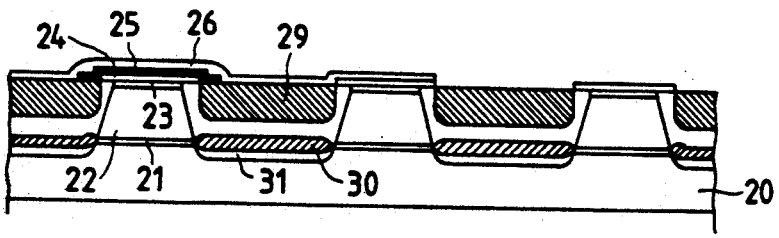
Figure 20A:
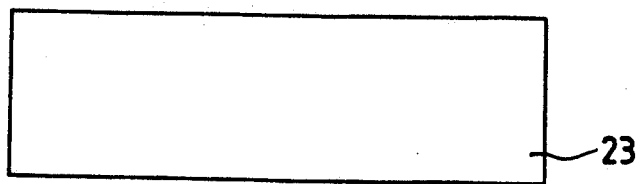
FIGS. 20 (a) to 20 (f) are plan views corresponding to the sectional views shown in FIGS. 19 (a) to 19 (f)
Figure 20B:
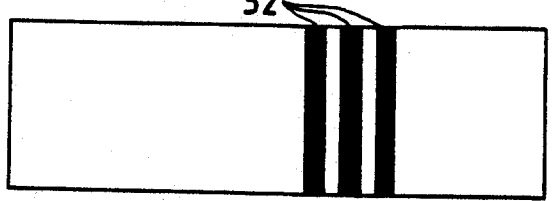
Figure 20C:
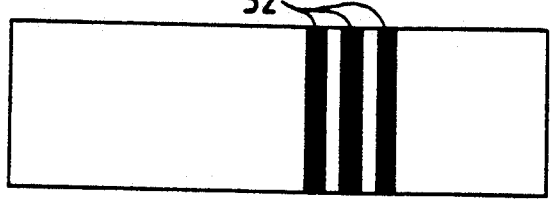
Figure 20D:
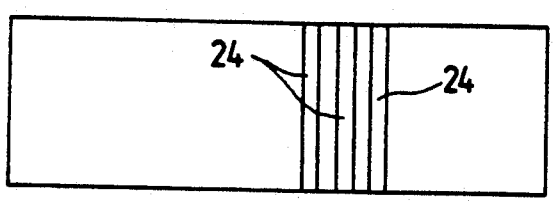
Figure 20E:
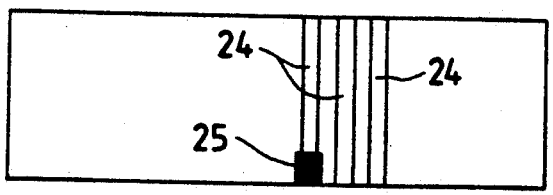
Figure 20F:
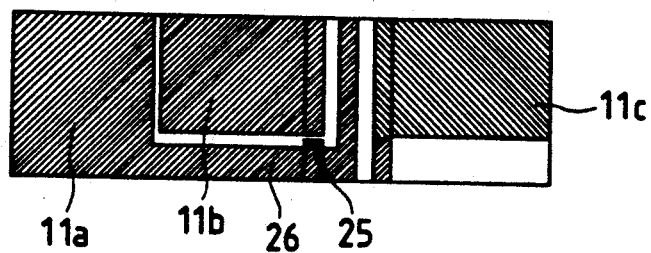

FIG. 17 shows a perspective view of an embodiment of a multibeam semiconductor laser array according to the present invention. FIG. 18 shows a cross-sectional view of the semiconductor laser array shown in FIG. 17, taken along the line X—X.

A multibeam semiconductor laser array according to the present embodiment comprises three semiconductor laser elements 15 which are disposed on the same substrate 10 at an interval r from one another. Each of the semiconductor laser elements 15 is formed in a double hetero structure of an AlGaAs system and keeps therein lateral current and light by use of disordering due to impurity diffusion, that is, impurity-induced disordering. The light emitting wave length of the semiconductor laser element 15 is 0.78 $\mu$m and a stripe width 28 thereof is approximately 3 $\mu$m. In this case, since the divergence angle $\theta_1$ of a laser beam 16 in the direction parallel to the contact surface of the semiconductor laser element is approximately 12°, $r=7.0$ $\mu$m ($k=1.5$) is given according to the above-mentioned equation. Further, the divergence angle $\theta_2$ of the laser beam in the direction perpendicular to the contact surface is approximately 48° and the shape of the section 16 of the laser beam is an oval which is elongated in the direction perpendicular to that in which the semiconductor laser elements 15 are disposed.

The substrate 10 is a GaAs substrate with silicon (Si) doped. Both an n-type clad layer 20 and a p-type clad layer 22 of the semiconductor laser element are formed of $Al_{0.4}Ga_{0.6}As$ and have a thickness of 1.0 $\mu$m, while an active layer 21 of the semiconductor laser element is formed of $Al_{0.1}Ga_{0.9}As$ and has a thickness of 0.1 $\mu$m. Se is doped in the clad layer 20 on the substrate side to thereby make the clad layer 20 an n-type layer with a carrier concentration of $1.0 \times 10^{18}$ cm$^{-3}$. Also, Mg is doped in the upper clad layer 22 to thereby make the clad layer 22 p-type layer with a carrier concentration of $1.0 \times 10^{18}$ cm$^{-3}$. The active layer 21 is interposed between the two clad layers. On the upper portion of the upper p-type clad layer 22, there is disposed a cap layer 23 which is used to make an ohmic contact. The cap layer 23 is formed of GaAs with Mg doped therein and has a thickness of 0.1 $\mu$m. The carrier concentration of the cap layer 23 is $1.0 \times 10^{18}$ cm$^{-3}$. Referring to the dimensions of the entire multibeam semiconductor laser array, the cavity length L1 is 250 $\mu$m, the width L2 is 800 $\mu$m, and the thickness L3 is 100 $\mu$m.

On the upper surface of the substrate 10, there are disposed bonding pads 11a-11c which can be use take out external electrodes from the substrate 10. The size of each bonding pad is 200 $\mu$m $\times$ 200 $\mu$m. In order to connect the centrally positioned semiconductor laser element in the three semiconductor laser elements with the bonding pad 11a corresponding thereto, there is provided a polyimide coating 25 on a contact electrode 24 of the adjoining semiconductor laser element, and also there is provided a connecting electrode 26 on the polyimide coating 25. The polyimide coating 25 is used to insulate the contact electrode 24 from the connecting electrode 26. The contact electrode 24 is formed of a gold zinc alloy (Au - Zn) which is able to make an ohmic contact with the cap layer 23 with ease, and the bonding pads 11a-11c and connecting electrode 26 are respectively formed of a gold stannum alloy (Au - Sn) which is easy to bond to the gold wire (Au) of a bonding wire 12. Into an area not in contact with the contact electrode 24, protons are bombarded down to the depth of approximately 0.5 $\mu$m of the upper p-type clad layer 22 to thereby form an insulated area 29, in order to prevent generation of any leak currents. Also, on the back surface of the GaAs substrate 10, there is provided a back surface electrode 27 formed of a gold germanium alloy (Au - Ge). If the stripe width 28 is increased, then the divergence angle $\theta_1$ of the laser beam in the direction parallel to the contact surface can be truly reduced. However, in the semiconductor laser of this structure, if the stripe width exceeds 6 μm, then a lateral mode becomes unstable. For this reason, the practical value of the stripe width 28 may be around 3 μm.

On the end surface of the substrate 10 from which the laser light is leaving, there is applied a coating 13 which is formed of alumina ($Al_2O_3$) having a ¼ wave length, thereby lowering the reflectance thereof down to approximately 4%. On the other end surface of the substrate 10, there is applied an optical high reflectance coating 14 which is formed by coating alumina ($Al_2O_3$) having a ¼ wave length and silicon (Si) having a ¼ wave length alternately at three cycles, thereby providing a reflectance of approximately 98%.

In the embodiment shown in FIG. 18, reference numeral 36 designates a width of a diffusion area of 4 μm, reference numeral 37 designates a thickness of the diffusion area of 1.5 μm, and reference numeral 38 designates a thickness of an insulated (proton bombarded) area of 0.5 μm.

While description has been given heretofore of a case when the number of the semiconductor laser elements n=3, of course, by use of a similar structure, it is possible to realize a multibeam semiconductor laser array which includes an arbitrary number of semiconductor laser elements.

Now, description will be given below in brief of an example of a method of manufacturing the above-mentioned multibeam semiconductor laser array with reference to FIGS. 19 (a) to 19 (f) and 20 (a) to 20 (f). Here, FIGS. 20 (a) to 20 (f) are plan views which correspond to FIGS. 19 (a) to 19 (f), respectively.

At first, as shown in FIG. 19 (a), by use of MOCVD method, a Se-doped GaAs buffer layer of 0.5 μm (not shown), an n-type clad layer 20, an active layer 21, a p-type clad layer 22 and a cap layer 23 are grown epitaxially and sequentially on a silicon-doped n-type GaAs substrate 10.

Next, CVD method and photolithography are used in combination to form a silicon diffusion source 33 on the cap layer 23, as shown in FIG. 19 (b). Then, by means of diffusion in a diffusion furnace at a temperature of the order of 800° C. for several hours, silicon (Si) can be diffused into an epitaxial layer in a place where a diffusion block layer 32 is not present, and in an area 31 where Si has been diffused, the clad layers 20 and 22 and active layer 21 are crystal mixed together to thereby form such a structure as shown in FIG. 19 (c). This phenomenon is referred to as disordering due to impurity diffusion Due to the fact the crystal mixed area 30 has a wider gap and smaller refraction index when compared with the active layer 21, the crystal mixed area 30 is able to confine the lateral carrier and light therein.

Then, after removing a diffusion Cap layer ($Si_3N_4$) 34, diffusion source (Si) 33 and diffusion block layer ($Si_3N_4$) 32 by means of dry etching, a gold zinc alloy (Au - Zn) is attached by evaporation and then photolithography using a resist coating 35 is applied to thereby form a contact electrode 24. In this example, the wet etching has been carried out after evaporation. However, other methods can also be employed. For example, a metal may be attached by evaporation onto a patterned resist and the resist may be then turned to ashes to thereby leave the evaporated coating in a place where no resist is present. In other words, a so-called lift-off method can be used to form a similar structure. By bombarding protons while leaving the resist 35 on the contact electrode 24, an insulated area 29 is formed. This is a so-called self-align process which uses the contact electrode 24 itself as a mask. In this manner, a structure shown in FIG. 19 (d) can be obtained.

Thereafter, the resist is removed and then a photosensitive polyimide is coated. After that, photolithography is enforced to thereby leave a polyimide coating 25 in part on the contact electrode 24, as shown in FIGS. 19 (e) and 20 (e).

Further, after the back surface electrode (Au - Ge) is attached by evaporation, the entire sample is thermally treated under a given condition, whereby an ohmic contact is formed and the polyimide coating 25 is baked. Alternatively, instead of the polyimide coating 25, $SiO_2$, $Si_3N_4$ or the like may be spattered or evaporated for attachment and then the lift-off may be carried out.

Thereafter, the bonding electrodes 11a–11c and connecting electrode 26 are formed according to the lift-off method as shown in FIGS. 19 (f) and 20 (f). Further, there are necessary a cleaving step, an end surface coating step, a die bonding step and a wire bonding step (which are not shown) to complete the multibeam semiconductor laser array. In addition, in FIGS. 20 (a) to 20 (f), there is shown an outer peripheral portion as if it were present, but this is drawn only for help of understanding and, in fact, such outer peripheral portion is not yet present in this stage.

As in the above-mentioned embodiment, by making the light emitting wave length of the semiconductor laser element 15 shorter than 0.8 μm, for example, by setting the wave length to 0.78 μm, an electrophotographic photoreceptor in currently practical use can be used to realize a laser beam printer of the above-mentioned interlaced scanning system.

Also, when the number of semiconductor laser elements n is set to be an odd number and the interlacing period I=2, in theory an interlaced scanning of the lowest order is possible and the accuracy required for a scanning device and an optical system can be controlled down to a level as low as required when the spots are densely arranged in the subsidiary scanning direction. Further, when the number of semiconductor laser elements n is odd number, by employing the same semiconductor laser structure, a distance between the elements is constant independently of the number of semiconductor laser elements and thus the same manufacturing process can be advantageously applied.

On the other hand, when the number of semi-conductor laser elements is an even number, by setting the interlacing period I to be the smallest natural number mutually prime to n equal to or more than 3, the accuracy required for the scanning device and optical system can be controlled down to the lowest level.

Figure 21:
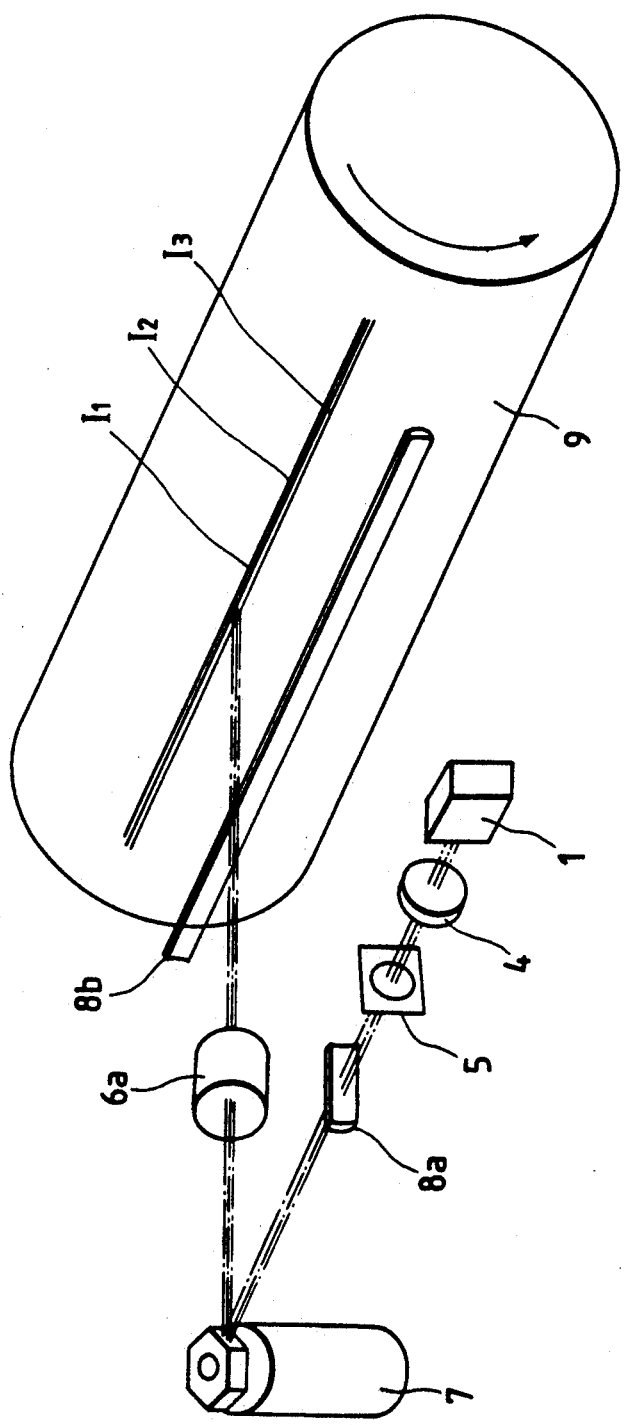
FIG. 21 is a perspective view of the structure of an embodiment of a laser beam printer according to the present invention.

Next, description will be given below of an embodiment of a laser beam printer constructed by use of the above-mentioned multibeam semiconductor laser array with reference to FIG. 21.

The present laser beam printer performs a scanning operation using a polygonal scanner 7 and the above-mentioned multibeam semiconductor laser array 1 as a light source.

Three laser light rays leaving from the multibeam semiconductor laser array 1 are converted to parallel beams by a collimator lens 4, then are stopped down by an optical stop 5 to a beam diameter for one-half of the center intensity, and are finally scanned by the polygonal scanner 7. Cylindrical lenses 8a and 8b form an anamorphic optical system for correction the effect that each facet of polygonal mirror is slightly different. Further, an f-θ lens 6a is used to focus the laser beam also to carry out a so-called f-θ correction. An optical image, which has been formed on a photoreceptor 9 rotating in the direction of an arrow shown in FIG. 21, is developed by means of an electrophotographic process and then transferred and fused onto normal paper. In FIG. 21, $I_1$- $I_3$ designate three scanning lines formed simultaneously on the photoreceptor 9, respectively.

According to the multibeam semiconductor laser array of the invention, all of the laser beams can be focused on the image plane by one and the same optical system in such a manner that condition for interlaced scanning is satisfied. Therefore, if the multibeam semiconductor laser array according to the present invention is used, then a laser beam printer, a digital copying machine and the like of high speed and high accuracy can be manufactured at low costs.

Also, according to the invention, in an optical system having a limited aperture size as well, images can be formed in such a manner that the condition for interlaced scanning is satisfied and, therefore, a laser beam printer can be constructed by use of an optical system having a relatively smaller aperture value (that is, a dark optical system). In other words, the present invention provides an effect that the optical system of the laser beam printer can be made compact. Especially, reducing the diameter of the polygonal scanner is important from the viewpoint of increase in speed of the laser beam printer.

What is claimed is:

1. A multibeam semiconductor laser array comprising n independently addressable semiconductor lasers which are arranged with a distance r between the lasers, wherein laser beams emitted from centers of respective semiconductor lasers are aligned on a straight line and the distance r is determined according to the following equation when a light emitting wave length of each of the semiconductor lasers is expressed as λ and a divergence panel of the laser beams in a direction of the straight line is expressed as $\theta_1$:

$$r = I \cdot \frac{2\lambda}{k\pi \sin(\theta_1/2)}$$

such that r>(2* a laser width) and where n is an integer equal to or more than 2, π is a circle ratio, $\Theta_1>0$, I is an interlacing period of the lasers which is a natural number mutually prime to n, and k is a spot diameter correction coefficient which is a real number in a range of $1.4 \leq k \leq 1.8$.

2. The multibeam semiconductor laser array according to claim 1, wherein n is an odd number and I is equal to 2.

3. The multibeam semiconductor laser array according to claim 2, wherein n is equal to 3.

4. The multibeam semiconductor laser array according to claim 1, wherein n is an even number and I is a natural number equal to or more than 3.

5. A multibeam semiconductor laser array comprising n independently addressable semiconductor lasers which are arranged with a distance r between the lasers, wherein the laser beams emitted from centers of respective semiconductor lasers are aligned on a straight line and the distance r is determined according to the following equation when a light emitting wave length of each of the semiconductor lasers is expressed as λ and a divergence angle of the laser beams in a direction of the straight line is expressed as $\Theta_1$:

$$r = I \cdot \frac{2A\lambda}{k\pi \sin(\theta_1/2)}$$

such that r≦2 * a laser width and where n is an integer equal to or more than 2, π is a circle ratio, $\Theta_1>0$, I is an interlacing period of the lasers which is an integer mutually prime to n and in a range of $2 \leq I \leq 5$, k is a spot diameter correction coefficient which si a real number in a range of $1.4 \leq k \leq 1.8$, and A is a spot diameter enlargement coefficient which is a real number in a range of $1.34 \leq A \leq 1.97$.

6. The multibeam semiconductor laser array according to claim 5, wherein n is an odd number and I is equal to 2.

7. The multibeam semiconductor laser array according to claim 6, wherein n is equal to 3.

8. The multibeam semiconductor laser array according to claim 5, wherein n is an even number and I is a natural number equal to or more than 3.

9. A multibeam laser printer comprising:
a multibeam semiconductor laser array including n mutually independently addressable semiconductor lasers which are arranged with a distance r between the lasers, wherein laser beams emitting from centers of respective lasers are aligned on a straight line and the distance r is determined according o the following equation when a light emitting wave length of each of the semiconductor lasers is expressed as λ and a divergence angle of the laser beams in a direction of the straight line is expressed as $\Theta_1$:

$$r = I \cdot \frac{2A\lambda}{k\pi \sin(\theta_1/2)}$$

such that r>2 * a laser width and where n is an in the equal to or more than 2, π is a circle ratio, $\Theta_1>0$, I is an interlacing period of the lasers which is an integer mutually prime to n and in a range of $2 \leq I \leq 5$, k is a spot diameter correction coefficient which is a real number in a range of $1.4 \leq k \leq 1.8$, and A is a spot diameter enlargement coefficient which is a real number in a range of $1.34 \leq A \leq 1.97$; and
an optical stop for limiting a spread of the laser beams emitted from the multibeam semiconductor lasers in the direction of the straight line at a position of a beam diameter corresponding to between $1/e^2$ and ½ of an intensity of the centers of the laser beams, where e is a base of a natural logarithm.

10. The multibeam laser printer according to claim 9, wherein n is an odd number and I is equal to 2.

11. The multibeam laser printer according to claim 10, wherein n is equal to 3.

12. The multibeam laser printer according to claim 9, wherein n is an even number and I is a natural number equal to or more than 3.

13. The multibeam laser printer according to claim 9, further comprising a polygonal scanner for scanning the laser beams passed through the optical stop.

14. The multibeam laser printer according to claim 13, further comprising a lens for focusing the laser beams from the polygonal scanner on a photoreceptor.

* * * * *

UNITED STATES PATENT AND TRADEMARK OFFICE
CERTIFICATE OF CORRECTION

PATENT NO. : 5,300,956
DATED : April 05, 1994
INVENTOR(S) : Takeshi OTA et al.

It is certified that error appears in the above-indentified patent and that said Letters Patent is hereby corrected as shown below:

On the title page:

Item [19]     change "Ohta et al." to --Ota et al. --.

Item [75]     Inventors change "Ohta" to --Ota--.

9th line of abstract change "wave length" to --wavelength--.

Claim 1, column 15, line 37 change "wave length" to --wavelength--.

Claim 1, column 15, line 39 change "panel" to --angle--.

Claim 1, column 15, line 45 change "r>(2* a laser width)" to --$r \geq 2*$ a laser width--.

UNITED STATES PATENT AND TRADEMARK OFFICE
CERTIFICATE OF CORRECTION

PATENT NO. : 5,300,956          Page 2 of 4
DATED      : April 05, 1994
INVENTOR(S): Takeshi OTA et al.

It is certified that error appears in the above-indentified patent and that said Letters Patent is hereby corrected as shown below:

Claim 9, column 16, line 31 change "wave length" to --wavelength--.

Claim 9, column 16, line 34 change "Θ" to --$\theta$--.

Claim 9, column 16, line 39 change "r>2*" to --$r \geq 2*$-- and change "in the" to --integer--.

Claim 9, column 16, line 40 change "Θ" to --$\theta$--.

UNITED STATES PATENT AND TRADEMARK OFFICE
CERTIFICATE OF CORRECTION

PATENT NO. : 5,300,956  
DATED : April 05, 1994  
INVENTOR(S) : Takeshi OTA et al.

It is certified that error appears in the above-indentified patent and that said Letters Patent is hereby corrected as shown below:

Claim 1, column 15, line 46 change "$\Theta$" to --$\theta$--.

Claim 5, column 15, line 62 change delete "the"

Claim 5, column 15, line 65 change "wave length" to --wavelength--.

Claim 5, column 16, line 2 change "$\Theta$" to --$\theta$--.

Claim 5, column 16, line 7 change "$r \leq 2*$" to --$r \geq 2*$--.

UNITED STATES PATENT AND TRADEMARK OFFICE
CERTIFICATE OF CORRECTION

PATENT NO. : 5,300,956  
DATED : April 5, 1994  
INVENTOR(S) : Takeshi Ota et al Page 4 of 4

It is certified that error appears in the above-indentified patent and that said Letters Patent is hereby corrected as shown below:

Claim 5, column 16, line 11 change "si" to --is --.

Claim 9, column 16, line 30 change "o" to --to --.

Signed and Sealed this

Twenty-fifth Day of April, 1995

BRUCE LEHMAN

Attest:

Attesting Officer

Commissioner of Patents and Trademarks